(12) United States Patent
Clark

(10) Patent No.: US 10,991,375 B2
(45) Date of Patent: *Apr. 27, 2021

(54) SYSTEMS AND METHODS FOR PROCESSING AN AUDIO SIGNAL FOR REPLAY ON AN AUDIO DEVICE

(71) Applicant: Mimi Hearing Technologies GmbH, Berlin (DE)

(72) Inventor: Nicholas R. Clark, Royston (GB)

(73) Assignee: Mimi Hearing Technologies GmbH, Berlin (DE)

( * ) Notice: Subject to any disclaimer, the term of this patent is extended or adjusted under 35 U.S.C. 154(b) by 152 days.

This patent is subject to a terminal disclaimer.

(21) Appl. No.: 16/244,727

(22) Filed: Jan. 10, 2019

(65) Prior Publication Data

US 2019/0392849 A1 Dec. 26, 2019

Related U.S. Application Data

(63) Continuation-in-part of application No. 16/019,230, filed on Jun. 26, 2018, now Pat. No. 10,199,047.

(30) Foreign Application Priority Data

Jun. 20, 2018 (EP) .................................. 18178873

(51) Int. Cl.
*G10L 19/02* (2013.01)

(52) U.S. Cl.
CPC ................. *G10L 19/0204* (2013.01)

(58) Field of Classification Search
CPC .................................................. G10L 19/0204

(Continued)

(56) References Cited

U.S. PATENT DOCUMENTS

| 4,180,707 A | 12/1979 | Moog |
| 5,259,033 A | 11/1993 | Goodings et al. |

(Continued)

FOREIGN PATENT DOCUMENTS

ES    2319955 A1    5/2009

OTHER PUBLICATIONS

Clark, Nicholas R., et al; "A frequency-selective feedback model of auditory efferent suppression and its implications for the recognition of speech in noise."; The Journal of the Acoustical Society of America 132.3 (2012); 1535-1541; Year 2012.

(Continued)

*Primary Examiner* — Quynh H Nguyen
(74) *Attorney, Agent, or Firm* — Polsinelli PC

(57) ABSTRACT

Systems and methods for processing an audio signal are provided for replay on an audio device. An audio signal is spectrally decomposed into a plurality of subband signals using and pass filters. Each of the subband signals are provided to a respective modulator and subsequently, from the modulator output, provided to a respective first processing path that includes a first dynamic range compressor, DRC. Each subband signal is feedforward compressed by the respective first DRC to obtain a feedforward-compressed subband signal, wherein the first DRC is slowed relative to an instantaneous DRC. Subsequently, each feedforward-compressed subband signal is provided to a second processing path that includes a second DRC, wherein the feedforward-compressed subband signal is compressed by the respective second DRC and outputted to the respective modulator. Modulation of the subband signals is then performed in dependence on the output of the second processing path. Finally, the feedforward-compressed subband signals are recombined.

20 Claims, 14 Drawing Sheets

(58) Field of Classification Search
USPC .......................................................... 704/251
See application file for complete search history.

(56) References Cited

U.S. PATENT DOCUMENTS

| | | | |
|---|---|---|---|
| 5,606,642 | A | 2/1997 | Stautner et al. |
| 5,832,444 | A | 11/1998 | Schmidt |
| 6,219,427 | B1 | 4/2001 | Kates et al. |
| 6,240,192 | B1 | 5/2001 | Brennan et al. |
| 6,947,509 | B1 | 9/2005 | Wong |
| 6,970,570 | B2 | 11/2005 | Goldstein |
| 6,993,480 | B1 | 1/2006 | Klayman |
| 8,229,125 | B2 | 7/2012 | Short |
| 8,861,760 | B2 | 10/2014 | Strelcyk |
| 2002/0057808 | A1 | 5/2002 | Goldstein |
| 2003/0142840 | A1 | 7/2003 | Orban |
| 2003/0198357 | A1 | 10/2003 | Schneider et al. |
| 2008/0043866 | A1* | 2/2008 | Mujtaba ............. H04L 27/2628 375/260 |
| 2009/0226016 | A1 | 9/2009 | Fitz et al. |
| 2009/0304203 | A1 | 12/2009 | Haykin et al. |
| 2010/0204996 | A1 | 8/2010 | Zeng et al. |
| 2012/0134522 | A1 | 5/2012 | Jenison et al. |
| 2015/0281853 | A1 | 10/2015 | Eisner et al. |
| 2016/0072467 | A1 | 3/2016 | Seefeldt |
| 2016/0241215 | A1 | 8/2016 | Seefeldt |
| 2018/0254787 | A1* | 9/2018 | Goodson ................ H04B 1/109 |

OTHER PUBLICATIONS

Giannoulis, Dimitrios, et al.; "Digital dynamic range compressor design—A tutorial and analysis."; Journal of the Audio Engineering Society 60.6 (2012); 399-408; Year 2012.

Jurgens, Tim, et al.; "Exploration of a physiologically-inspired hearing-aid algorithm using a computer model mimicking impaired hearing."; International Journal of Audiology 55.6 (2016); 399-408; Year 2012.

* cited by examiner

FIGURE 7
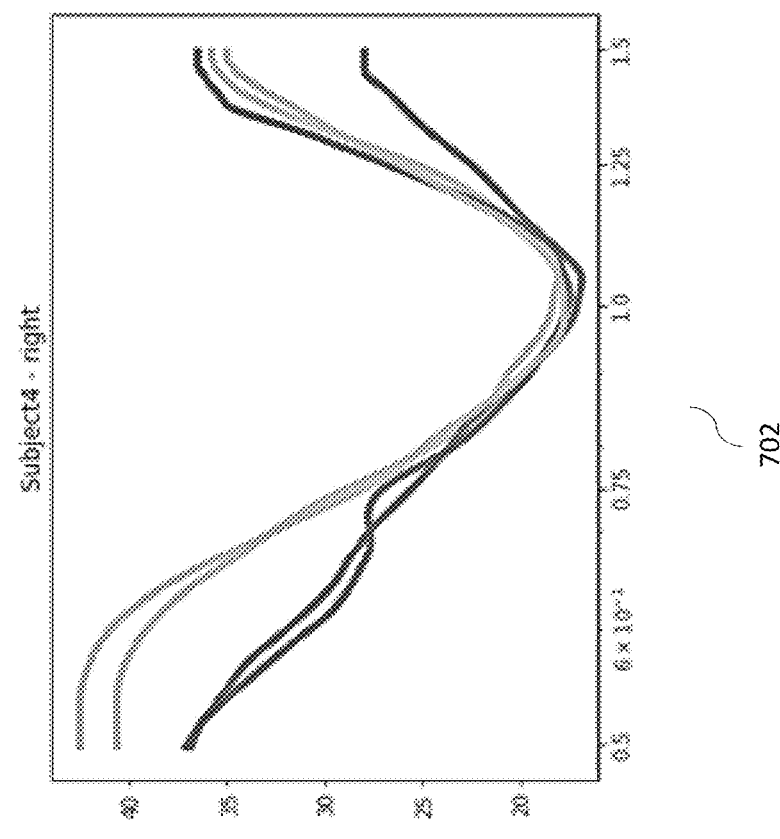
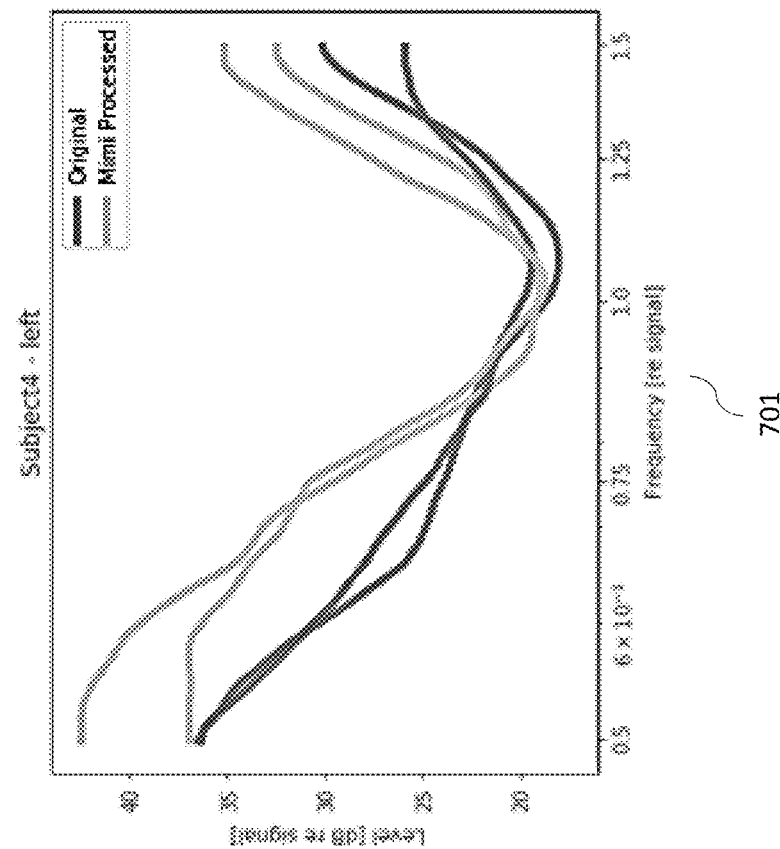

SYSTEMS AND METHODS FOR PROCESSING AN AUDIO SIGNAL FOR REPLAY ON AN AUDIO DEVICE

CROSS-REFERENCE TO RELATED APPLICATIONS

This application is a continuation-in-part of U.S. application Ser. No. 16/019,230 filed Jun. 26, 2018 and entitled "SYSTEMS AND METHODS FOR PROCESSING AN AUDIO SIGNAL FOR REPLAY ON AN AUDIO DEVICE", the disclosure of which is herein incorporated by reference in its entirety.

FIELD OF INVENTION

This invention relates generally to the field of digital signal processing (DSP), audio engineering and audiology—more specifically systems and methods for processing an audio signal for replay on an audio device, for example for providing an enhanced listening experience on the audio device.

BACKGROUND

Traditional DSP sound personalization methods often rely on equalization techniques that apply compensatory frequency gain according to a user's hearing profile (see e.g. U.S. Pat. Nos. 9,138,178, 9,468,401 9,680,438, 9,898,248). Typically, a pure tone threshold (PTT) hearing test is employed to identify frequencies in which a user exhibits raised hearing thresholds. Based on the audiogram data, the frequency output is then modulated accordingly. In this regard, the approach to augmenting the sound experience for the user is one dimensional. The gain may enable the user to recapture previously unheard frequencies, however they may subsequently experience loudness discomfort. Listeners with sensorineural hearing loss typically have similar, or even reduced, discomfort thresholds when compared to normal hearing listeners, despite their hearing thresholds being raised. To this extent, their dynamic range is narrower and simply adding EQ gain would be detrimental to their hearing health in the long run (FIG. 1).

Dynamic range compression (DRC) can be used to address this issue by amplifying quieter sounds while reducing the volume of loud sounds, thus narrowing the dynamic range of the audio. However, this could pose a problem, as a low frequency rumble could prevent amplification of a high frequency sound of interest. For this reason, hearing aid processors employ wide dynamic range compression where the faintest sounds are amplified considerably, but where high-intensity sounds are not. To this extent, conventional hearing aids are designed for use in real world situations where a wide dynamic range of sounds are relevant to the listener, i.e. the listener wants to make sense of sonic information such as a loud-voiced person speaking in front of them, while at the same time they want to be able to detect the faint sound of a car approaching them from a distance while walking down the street. Although this works for practical, real world matters, audio content consumed on mobile devices, or other similar devices, have very different signal statistics to the sounds that someone will encounter in their daily life, so a different processing strategy is required to provide the listener with a beneficial sound personalization experience.

The ability to digitally recreate the functional processing of healthy human hearing would enable a more natural and clear listening experience for a hearing impaired (HI) user. Only until recently has the physics of the human ear been well characterized. The human ear pre-processes sounds into a format that is optimal for transmission to the brain to make sense of the sonic environment. The pre-processing can be modelled as a number of hierarchical signal processes and feedback loops, many of which are non-linear, resulting in a complex, non-linear system. Although hearing loss typically begins at higher frequencies, listeners who are aware that they have hearing loss do not typically complain about the absence of high frequency sounds. Instead, they report difficulties listening in a noisy environment and in hearing out the details in a complex mixture of sounds, such as in an audio stream. In essence, off frequency sounds more readily mask information with energy in other frequencies for HI individuals—music that was once clear and rich in detail becomes muddled. This is because music itself is highly self-masking.

As hearing deteriorates, the signal-conditioning capabilities of the ear begin to break down, and thus HI listeners need to expend more mental effort to make sense of sounds of interest in complex acoustic scenes (or miss the information entirely). A raised threshold in an audiogram is not merely a reduction in aural sensitivity, but a result of the malfunction of some deeper processes within the auditory system that have implications beyond the detection of faint sounds.

Recent studies attempted to better model the physics of the human ear, modelling the interconnection of the basilar membrane, the medial olivocochlear complex and the inner and outer hair cells within the middle ear. Building on hearing aid format technology, Clark et al. (2012) developed an algorithm to better model human hearing, mimicking the attenuation effect of the medial olivocochlear to the basilar membrane, which data from the aforementioned suggests might improve speech-in-noise robustness (see: Clark et al., A frequency-selective feedback model of auditory efferent suppression and its implications for the recognition of speech in noise. Journal of the acoustical society of America, Volume 132, issue 3, pages 1535 to 1541, 2012). This result is achieved by implementing a delayed feedback attenuation control (DFAC) to a dual resonance non-linear (DRNL) algorithm within a spectrally decomposed system (for DRNL see: E. Lopez-Poveda and R. Meddis. A human nonlinear cochlear filterbank. Journal of the acoustical society of America, Volume 110, issue 6, Pages 3107 to 3118, 2001). The DRNL algorithm includes instantaneous dynamic range compression.

However, this algorithm served merely as a framework for modeling the hearing system and was not specifically designed for sound augmentation. To this extent, it has some drawbacks on the subjective hearing experience caused by the lack of control over the distortion products. These include a reduced ability to control distortion, a limited frequency resolution and phase distortion that can cause temporal smearing of sound (if used in combination with narrowband filters) and therefore reduced clarity. Namely, although this algorithm could potentially improve some aspects of real-world use cases if used by hard of hearing users, it would fail to improve the listening experience for a broader category of listeners in the context of audio. Accordingly, it is the object of this invention to create an improved, biologically-inspired DSP that provides a listener with beneficial sound personalization.

SUMMARY OF THE INVENTION

The problems raised in the known prior art will be at least partially solved in the invention as described below. The features according to the invention are specified within the independent claims, advantageous implementations of which will be shown in the dependent claims. The features of the claims can be combined in any technically meaningful way, and the explanations from the following specification as well as features from the figures which show additional embodiments of the invention can be considered.

By creating improved, biologically-inspired DSP algorithms that more closely mimic the functional processing of the healthy human ear, the presented technology solves the limitations inherent in prior art DSP methodologies, namely poor frequency resolution and temporal smearing caused by group delay differences between bands. To this extent, the invention provides an enhanced listening experience on an audio device for both hard of hearing listeners as well as individuals with low to moderate hearing loss, who experience dearer listening experience.

In general, the technology features methods for processing an audio signal for replay on an audio device. In particular, the methods may be methods of processing an audio signal to provide an enhanced hearing experience on (e.g., when replayed on) an audio device.

According to an aspect, a method of processing an audio signal for replay on an audio device may include a) spectral decomposition of the audio signal into a plurality of frequency bands (e.g., into a plurality of subband signals, each subband signal in a respective frequency band) using a bandpass filter (e.g., an input bandpass filter). The method may further include b) for each frequency band, providing the audio signal in the frequency band (e.g., the subband signal) to a respective modulator and from the modulator output, providing the audio signal in the frequency band to a respective first dynamic range compressor (e.g., to a feedforward DRC as an example of the first DRC). The feedforward DRC may be part of a first processing path for the respective frequency band (or subband signal), and the (modulated) audio signal in the frequency band (e.g., the subband signal) may be provided to the first processing path. The first processing path may be referred to as a feedforward path. The method may further include c) for each frequency band, feedforward compressing the modulated audio signal in the frequency band (e.g., the modulated subband signal) to obtain a feedforward-compressed audio signal in the respective frequency band (e.g., a feedforward-compressed subband signal). Therein, the feedforward DRC is slowed relative to an instantaneous DRC. This slowing may be done either directly or indirectly. By virtue of this slowing of dynamic range compression, the spectral spread of harmonic distortion and intermodulation distortion products can be controlled. The feedforward compressed frequency band (e.g., the feedforward-compressed audio signal in the frequency band, or the feedforward-compressed subband signal) may be provided to a respective compression output. The method may further include d) for each frequency band, feedback compressing each feedforward compressed frequency band from the respective compression output. To this end, each feedforward compressed frequency band may be provided to a respective second processing path that includes a respective second DRC. The second processing path may be referred to as a feedback path. The second DRC may be referred to as a feedback DRC (as an example of the second DRC). Further, the feedback DRC may be delayed relative to the feedforward DRC. That is, the output of the second processing path may be deliberately delayed, e.g., by a delay element (such a s a buffer, for example). The delay may be inserted before or after the feedback DRC. The (delayed) feedback compressed frequency band is then provided to the modulator for the respective frequency band. In general, the output of the second processing path is provided to the respective modulator. The modulator may operate in dependence on (e.g., under control of) the output of the second processing path. The modulator may provide attenuation at the compression input of step c, in dependence on the output of the second processing path. The method may further include e) recombining the feedforward-compressed frequency bands (e.g., the feedforward-compressed audio signals in the frequency bands, or the feedforward-compressed subband signals).

Configured as above, the proposed method has the advantage and technical effect of providing an enhanced listening experience for a user. This is achieved by processing an audio signal using techniques that mimic the functional processing of the healthy human auditory system.

In one embodiment, the input band pass filter is phase linear. In a further embodiment, the phase linear input band pass filter is a finite impulse response filter operating in the frequency domain.

In some embodiments, slowing the first DRC relative to the instantaneous DRC may relate to oversampling the respective subband signal. For example, the oversampling may comprise applying an n-point FFT to the subband signal and overlapping the FFT transforms by n/N samples, where N is the oversampling rate and n is larger than N. For a given n, the oversampling rate N may range from 2 to n/2, for example (which translates into an overlap in the range between n/2 samples and 2 samples). For typical implementations (e.g., n=256, 512, 1024), the oversampling rate N may be in the range from 128 to 512, for example.

In some embodiments, slowing the first DRC relative to the instantaneous DRC may relate to increasing attack and/or release time constants of the first DRC (i.e., setting the attack and/or release time constants to values different from 0). For example, slowing the first DRC relative to the instantaneous DRC may relate to setting attack and/or release time constants of the first DRC based on a time constant T that is selected from a range extending from 0.01 ms to 3 ms. Likewise, slowing the first DRC relative to the instantaneous DRC may relate to setting attack and/or release time constants of the first DRC based on a time constant T that corresponds to a frequency f within the respective (frequency) subband. This frequency may be the lower cutoff frequency, the upper cutoff frequency, or the center frequency of the subband.

In some embodiments, slowing the first DRC relative to the instantaneous DRC may relate to both oversampling the respective subband signal as well as to increasing attack and/or release time constants of the first DRC (i.e., setting the attack and/or release time constants to values different from 0). One of ordinary skill in the art may appreciate that slowing the first DRC may be achieved through the combination of both indirect slowing (i.e. oversampling) and direct slowing (i.e. altering the time constants of the first DRC). For direct slowing, $\tau$ is related to the cutoff frequency $f_c$, an alternative parameter of the RC circuit, by $\tau = RC = 1/(2\pi f_c)$. An (indirect) equivalent of the time constant T of the directly slowed first DRC for the slowing by oversampling can be calculated by dividing the oversampling rate N by the sampling rate (e.g. 44100 Hz). To this extent, the combinatorial effect of indirect and direct slowing of the DRC is readily calculable as a function of these two values.

According to another aspect, a method of processing an audio signal to provide an enhanced hearing experience on (e.g., when replayed on) an audio device may comprise dividing an unprocessed audio signal into a first signal pathway and a second signal pathway, processing the audio signal in the first signal pathway, and recombining outputs of the first signal and second signal pathways at a ratio. The processing in the first signal pathway may include a) performing a spectral decomposition of the audio signal in the first signal pathway into a plurality of subband signals using a band pass filter. The processing in the first signal pathway may further include b) for each subband signal, providing the subband signal to a respective modulator and from the modulator output, providing the subband signal to a respective first processing path that includes a first dynamic range compressor, DRC. The first processing path may be referred to as a feedforward path. The processing in the first signal pathway may further include c) for each subband signal, feedforward compressing the subband signal by the respective first DRC to obtain a feedforward-compressed audio signal in the respective frequency band (e.g., a feedforward compressed subband signal). Therein, the feedforward DRC is slowed relative to an instantaneous DRC. This slowing may be done either directly or indirectly. By virtue of this slowing of dynamic range compression, the spectral spread of harmonic distortion and intermodulation distortion products can be controlled. The feedforward compressed frequency band (e.g., the feedforward-compressed audio signal in the frequency band, or the feedforward-compressed subband signal) may be provided to a respective compression output. The processing in the first signal pathway may further include d) feedback compressing each feedforward compressed frequency band from the respective compression output. To this end, each feedforward compressed frequency band may be provided to a respective second processing path that includes a respective second DRC. The second processing path may be referred to as a feedback path. The second DRC may be referred to as a feedback DRC (as an example of the second DRC). Further, the feedback DRC may be delayed relative to the feedforward DRC. That is, the output of the second processing path may be deliberately delayed, e.g., by a delay element (such as a buffer, for example). The delay may be inserted before or after the feedback DRC. The (delayed) feedback compressed frequency band is then provided to the modulator for the respective frequency band. In general, the output of the second processing path is provided to the respective modulator. The modulator may operate in dependence on (e.g., under control of) the output of the second processing path. The modulator may provide attenuation at the compression input of step c, in dependence on the output of the second processing path. The processing in the first signal pathway may further include e) recombining the feedforward-compressed frequency bands (e.g., the feedforward-compressed audio signals in the frequency bands, or the feedforward-compressed subband signals).

In one embodiment, the input band pass filter is phase linear. In a further embodiment, the phase linear input band pass filter is a finite impulse response filter operating in the frequency domain.

In some embodiments, slowing the first DRC relative to the instantaneous DRC may relate to oversampling the respective subband signal. For example, the oversampling may comprise applying an n-point FFT to the subband signal and overlapping the FFT transforms by n/N samples, where N is the oversampling rate and n is larger than N. For a given n, the oversampling rate N may range from 2 to n/2, for example (which translates into an overlap in the range between n/2 samples and 2 samples). For typical implementations (e.g., n=256, 512, 1024), the oversampling rate N may be in the range from 128 to 512, for example.

In some embodiments, slowing the first DRC relative to the instantaneous DRC may relate to increasing attack and/or release time constants of the first DRC (i.e., setting the attack and/or release time constants to values different from 0). For example, slowing the first DRC relative to the instantaneous DRC may relate to setting attack and/or release time constants of the first DRC based on a time constant T that is selected from a range extending from 0.01 ms to 3 ms. Likewise, slowing the first DRC relative to the instantaneous DRC may relate to setting attack and/or release time constants of the first DRC based on a time constant T that corresponds to a frequency f within the respective (frequency) subband. This frequency may be the lower cutoff frequency, the upper cutoff frequency, or the center frequency of the subband.

In some embodiments, slowing the first DRC relative to the instantaneous DRC may relate to both oversampling the respective subband signal as well as to increasing attack and/or release time constants of the first DRC (i.e., setting the attack and/or release time constants to values different from 0). One of ordinary skill in the art may appreciate that slowing the first DRC may be achieved through the combination of both indirect slowing (i.e. oversampling) and direct slowing (i.e. altering the time constants of the first DRC). For direct slowing, $\tau$ is related to the cutoff frequency $f_c$, an alternative parameter of the RC circuit, by $\tau=RC=1/(2\pi f_c)$. An (indirect) equivalent of the time constant T of the directly slowed first DRC for the slowing by oversampling can be calculated by dividing the oversampling rate N by the sampling rate (e.g. 44100 Hz). To this extent, the combinatorial effect of indirect and direct slowing of the DRC is readily calculable as a function of these two values.

According to another aspect, in a method of processing an audio signal to provide an enhanced hearing experience on (e.g., when replayed on) an audio device, the subband signal itself may further be split into a first signal pathway and a second signal pathway and recombined at a ratio. Thus, the method may include a) performing a spectral decomposition of the audio signal into a plurality of subband signals using a band pass filter. The method may further include b) for each subband signal, dividing the subband signal into a first signal pathway and a second signal pathway, processing the subband signal in the first signal pathway, and recombining the first and second signal pathways at a ratio to obtain a processed subband signal. Processing the subband signal in the first signal pathway may comprise b1) providing the audio signal in the frequency band (e.g., the subband signal) to a respective modulator and from the modulator output, providing the audio signal in the frequency band to a respective first dynamic range compressor (e.g., to a feedforward DRC as an example of the first DRC). The feedforward DRC may be part of a first processing path for the respective frequency band (or subband signal), and the (modulated) audio signal in the frequency band (e.g., the subband signal) may be provided to the first processing path. The first processing path may be referred to as a feedforward path. Processing the subband signal in the first signal pathway may further comprise b2) feedforward compressing the audio signal in the frequency band (e.g., the modulated subband signal) by the respective first DRC to obtain a feedforward-compressed audio signal (e.g., a feedforward-compressed subband signal). Therein, the feedforward DRC is slowed relative to an instantaneous DRC. This slowing may be done either directly or indirectly. By virtue of this slowing of dynamic range compression, the spectral spread of harmonic distortion and intermodulation distortion products can be controlled. The feedforward compressed frequency band (e.g., the feedforward-compressed audio signal in the frequency band, or the feedforward-compressed subband signal) may be provided to a respective compression output. Processing the subband signal in the first signal pathway may further comprise b3) feedback compressing the feedforward compressed frequency band from the respective compression output. To this end, the feedforward compressed frequency band may be provided to a respective second processing path that includes a respective second DRC. The second processing path may be referred to as a feedback path. The second DRC may be referred to as a feedback DRC (as an example of the second DRC). Further, the feedback DRC may be delayed relative to the feedforward DRC. That is, the output of the second processing path may be deliberately delayed, e.g., by a delay element (such as a buffer, for example). The delay may be inserted before or after the feedback DRC. The (delayed) feedback compressed frequency band is then provided to the modulator for the respective frequency band. In general, the output of the second processing path is provided to the respective modulator. The modulator may operate in dependence on (e.g., under control of) the output of the second processing path. The modulator may provide attenuation at the compression input of step b3, in dependence on the output of the second processing path. The method may further include c) recombining the feedforward-compressed frequency bands (e.g., the feedforward-compressed audio signals in the frequency bands, or the feedforward-compressed subband signals).

In one embodiment, the input band pass filter is phase linear. In a further embodiment, the phase linear input band pass filter is a finite impulse response filter operating in the frequency domain.

In some embodiments, slowing the first DRC relative to the instantaneous DRC may relate to oversampling the respective subband signal. For example, the oversampling may comprise applying an n-point FFT to the subband signal and overlapping the FFT transforms by n/N samples, where N is the oversampling rate and n is larger than N. For a given n, the oversampling rate N may range from 2 to n/2, for example (which translates into an overlap in the range between n/2 samples and 2 samples). For typical implementations (e.g., n=256, 512, 1024), the oversampling rate N may be in the range from 128 to 512, for example.

In some embodiments, slowing the first DRC relative to the instantaneous DRC may relate to increasing attack and/or release time constants of the first DRC (i.e., setting the attack and/or release time constants to values different from 0). For example, slowing the first DRC relative to the instantaneous DRC may relate to setting attack and/or release time constants of the first DRC based on a time constant T that is selected from a range extending from 0.01 ms to 3 ms. Likewise, slowing the first DRC relative to the instantaneous DRC may relate to setting attack and/or release time constants of the first DRC based on a time constant T that corresponds to a frequency f within the respective (frequency) subband. This frequency may be the lower cutoff frequency, the upper cutoff frequency, or the center frequency of the subband.

In some embodiments, slowing the first DRC relative to the instantaneous DRC may relate to both oversampling the respective subband signal as well as to increasing attack and/or release time constants of the first DRC (i.e., setting the attack and/or release time constants to values different from 0). One of ordinary skill in the art may appreciate that slowing the first DRC may be achieved through the combination of both indirect slowing (i.e. oversampling) and direct slowing (i.e. altering the time constants of the first DRC). For direct slowing, $\tau$ is related to the cutoff frequency $f_c$, an alternative parameter of the RC circuit, by $\tau=RC=1/(2\pi f_c)$. An (indirect) equivalent of the time constant T of the directly slowed first DRC for the slowing by oversampling can be calculated by dividing the oversampling rate N by the sampling rate (e.g. 44100 Hz). To this extent, the combinatorial effect of indirect and direct slowing of the DRC is readily calculable as a function of these two values.

According to another aspect, a method of processing an audio signal to provide an enhanced hearing experience on (e.g., when replayed on) an audio device may include a) spectral decomposition of an audio signal into a plurality of frequency bands (e.g., into a plurality of subband signals, each subband signal in a respective frequency band) using a bandpass filter (e.g., an input bandpass filter). The method may further include b) for each frequency band, providing the audio signal in the frequency band (e.g., the subband signal) to a respective modulator and from the modulator output, providing the audio signal in the frequency band to a respective first dynamic range compressor (e.g., to a feedforward DRC as an example of the first DRC). The feedforward DRC may be part of a first processing path for the respective frequency band (or subband signal), and the (modulated) audio signal in the frequency band (e.g., the subband signal) may be provided to the first processing path. The first processing path may be referred to as a feedforward path. The method may further include c) for each frequency band, feedforward compressing the modulated audio signal in the frequency band (e.g., the modulated subband signal) to obtain a feedforward-compressed audio signal in the respective frequency band (e.g., a feedforward-compressed subband signal). Therein, the feedforward DRC is slowed relative to an instantaneous DRC. This slowing may be done either directly or indirectly. By virtue of this slowing of dynamic range compression, the spectral spread of harmonic distortion and intermodulation distortion products can be controlled. The feedforward compressed frequency band (e.g., the feedforward-compressed audio signal in the frequency band, or the feedforward-compressed subband signal) may be provided to a respective compression output. The method may further include d) for each frequency band, providing the feedforward-compressed subband signal to a second processing path that includes a second DRC and further providing one or more feedforward-compressed subband signals from neighboring frequency bands, each weighted with a respective weighting factor, to the second processing path. Therein, in the second processing path, the feedforward-compressed subband signal and the weighted feedforward-compressed subband signals from the neighboring frequency subbands are compressed by the respective second DRC. The second DRC may be referred to as a feedback DRC (as an example of the second DRC). Further, the feedback DRC may be delayed relative to the feedforward DRC. That is, the output of the second processing path may be deliberately delayed, e.g., by a delay element (such as a buffer, for example). The delay may be inserted before or after the feedback DRC. The (delayed) feedback compressed frequency band is then provided to the modulator for the respective frequency band. In general, the output of the second processing path is provided to the respective modulator. The modulator may operate in dependence on (e.g., under control of) the output of the second processing path. The modulator may provide attenuation at the compression input of step c, in dependence on the output of the second processing path. The method may further include e) recombining the feedforward-compressed frequency bands (e.g., the feedforward-compressed audio signals in the frequency bands, or the feedforward-compressed subband signals).

In one embodiment, the input band pass filter is phase linear. In a further embodiment, the phase linear input band pass filter is a finite impulse response filter operating in the frequency domain.

In some embodiments, slowing the first DRC relative to the instantaneous DRC may relate to oversampling the respective subband signal. For example, the oversampling may comprise applying an n-point FFT to the subband signal and overlapping the FFT transforms by n/N samples, where N is the oversampling rate and n is larger than N. For a given n, the oversampling rate N may range from 2 to n/2, for example (which translates into an overlap in the range between n/2 samples and 2 samples). For typical implementations (e.g., n=256, 512, 1024), the oversampling rate N may be in the range from 128 to 512, for example.

In some embodiments, slowing the first DRC relative to the instantaneous DRC may relate to increasing attack and/or release time constants of the first DRC (i.e., setting the attack and/or release time constants to values different from 0). For example, slowing the first DRC relative to the instantaneous DRC may relate to setting attack and/or release time constants of the first DRC based on a time constant T that is selected from a range extending from 0.01 ms to 3 ms. Likewise, slowing the first DRC relative to the instantaneous DRC may relate to setting attack and/or release time constants of the first DRC based on a time constant T that corresponds to a frequency f within the respective (frequency) subband. This frequency may be the lower cutoff frequency, the upper cutoff frequency, or the center frequency of the subband.

In some embodiments, slowing the first DRC relative to the instantaneous DRC may relate to both oversampling the respective subband signal as well as to increasing attack and/or release time constants of the first DRC (i.e., setting the attack and/or release time constants to values different from 0). One of ordinary skill in the art may appreciate that slowing the first DRC may be achieved through the combination of both indirect slowing (i.e. oversampling) and direct slowing (i.e. altering the time constants of the first DRC). For direct slowing, $\tau$ is related to the cutoff frequency $f_c$, an alternative parameter of the RC circuit, by $\tau=RC=1/(2\pi f_c)$. An (indirect) equivalent of the time constant T of the directly slowed first DRC for the slowing by oversampling can be calculated by dividing the oversampling rate N by the sampling rate (e.g. 44100 Hz). To this extent, the combinatorial effect of indirect and direct slowing of the DRC is readily calculable as a function of these two values.

DSP methods that mimic the functional processing of the healthy human are vital to the creation of objectively and subjectively enriched listening experiences. By more precisely recreating the actions of the basilar membrane and MOC through sound processing, both the HI and healthy listener enjoy a clearer, more natural sound on an audio device.

Unless otherwise defined, all technical terms used herein have the same meaning as commonly understood by one of ordinary skill in the art to which this technology belongs.

The term "audio device", as used herein, is defined as any device that outputs audio, including, but not limited to: mobile phones, computers, televisions, hearing aids, headphones and/or speaker systems.

The phrase "dynamic range compression" or "DRC", as used herein, is defined as an audio process that reduces the dynamic range of an audio signal. A compressor may either have a feedforward or feedback design. Dynamic range compression may occur instantaneously or the rate may be controlled through adjustment of the compressor's attack and release time constants.

The phrase "indirectly slowed", as used herein, is defined as the slowing of a DRC through means other than adjusting a compressor's attack and release times, such as through multi-rate signal processing.

The phrase "directly slowed", as used herein, is defined as the slowing of a DRC through adjusting a compressor's attack and release time constants.

The phrase "bandpass filter", as used herein, is defined as a device that (substantially) passes frequencies within a certain range and attenuates frequencies outside that range.

The phrase "phase linear", as used herein, is defined as property wherein the phase response of a filter is a linear function of frequency such that all frequency components of an input signal are shifted in time by the same constant amount, resulting in no phase distortion.

The phrase "harmonic distortion", as used herein, is defined as the generation of multiples of the original frequencies caused by a nonlinear system.

The phrase "intermodulation distortion", as used herein, is defined as the generation of cross-product frequencies produced when two or more signals mix in a nonlinear system.

The phrase "computer readable storage medium", as used herein, is defined as a solid, non-transitory storage medium including, but not limited to: USB storages with flash memory, a CD-ROM, DVD or BluRay®, a disk or a tape. It may also be a physical storage place in a server accessible by a user, e.g. to download for installation of the computer program on her device or for cloud computing.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof, which are illustrated in the appended drawings. Understand that these drawings depict only example embodiments of the disclosure and are not therefore to be considered to be limiting of its scope, the principles herein are described and explained with additional specificity and detail through the use of the accompanying drawings in which:

FIG. 7 Illustrates an example of the biologically-designed DSP technology disclosed herein sharpening the psychometric tuning curve of an HI subject;

DETAILED DESCRIPTION

Various example embodiments of the disclosure are discussed in detail below. While specific implementations are discussed, these implementations are for illustration purposes only. One of ordinary skill in the art will recognize that other components and configurations may be used without parting from the spirit and scope of the disclosure.

Figure 1:
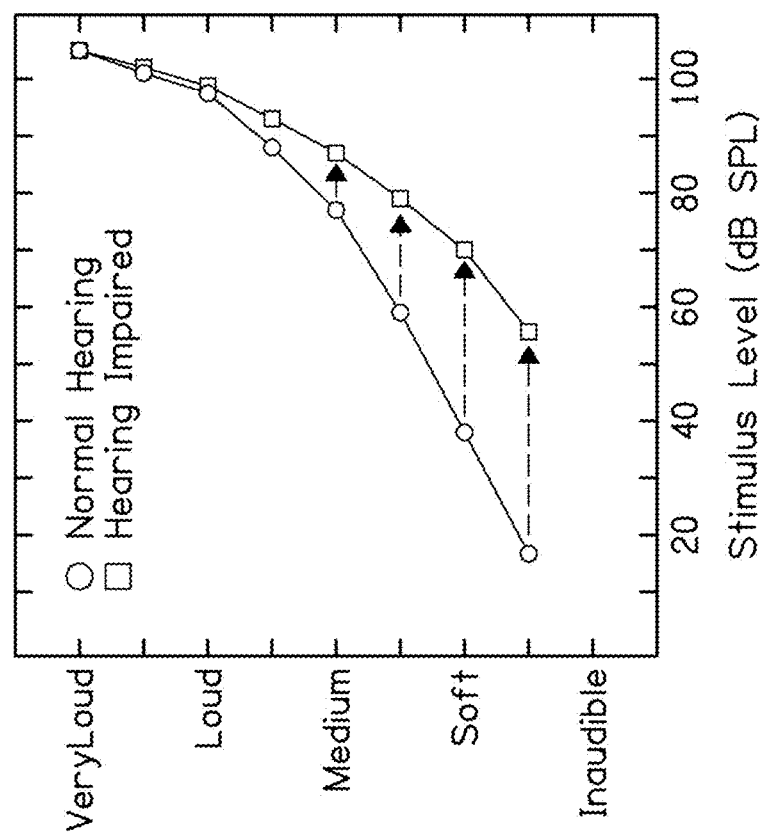
FIG. 1 illustrates a graph showing dynamic range reduction in hearing impaired listeners.
Figure 2:
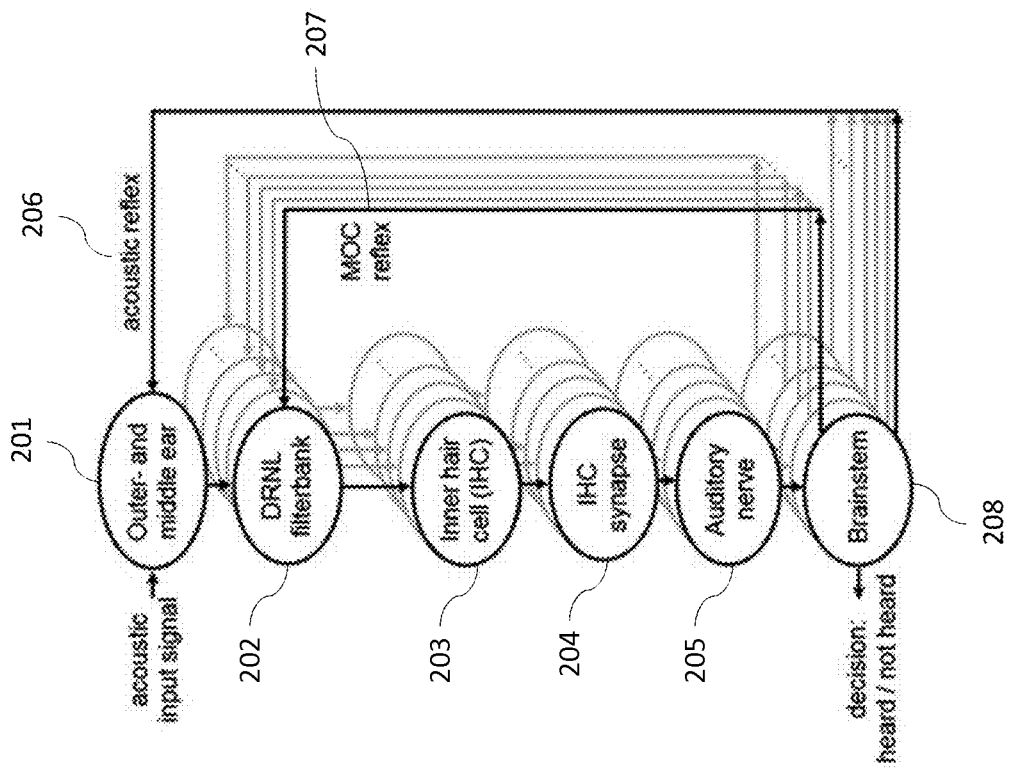
FIG. 2 illustrates a processing model of the auditory system and the afferent and efferent pathways that affect hearing modulation.

In order to create audio processing algorithms that mimic the functional processing of the human ear, a framework for healthy hearing must first be developed. Generally, the model of normal hearing consists of cascading stages, simulating the physiological parts of the signal processing pathway in the auditory system. The model developed by Meddis, R. (see Meddis, R., N. R. Clark, W. Lecluyse, and T. Jürgens, "BioAid—A Biologically Inspired Hearing Aid". *Audiological Acoustics* 52: 2013, 148-152, 2013) aimed to provide a faithful representation of auditory nerve firing patterns, as seen in the model of the auditory periphery in FIG. 2. Initially, the acoustic input signal is filtered—mimicking the outer- and middle-ear 201 frequency-dependent transfer of sound pressure to displacement of the stapes. Subsequently, the signal is decomposed into frequency bands using filter bank 202. The filter bank consists of a nonlinear path, modeling the contribution of outer hair cells and a linear path, modeling the passive response of the basilar membrane. Subsequent stages simulate stereo displacement, inner hair cell 203 potential fluctuations, and finally transmitter release into the synaptic cleft 204 located between inner hair cells and the auditory nerve 205.

To model the ipsilateral acoustic reflex (AR) 206 and the ipsilateral medial olivocochlear reflex (MOC) 207, two efferent feedback loops are added. The MOC 207 feedback loop is tonotopically implemented as an attenuation of activity in the nonlinear path of the of the filter bank—the amount of attenuation is controlled by the total spiking activity in the corresponding frequency band on the brainstem 208 level. The MOC attenuation of BM response builds up during steady portions of an acoustic stimulus and decays with a time constant 50 ms following the offset of the stimulus. A delay of 10 ms between the onset of a stimulus and the beginning MOC attenuation is used to mimic synaptic latencies. The acoustic reflex 206 is implemented as an attenuation of the stapes response on the total activity of all neurons.

Figure 3:
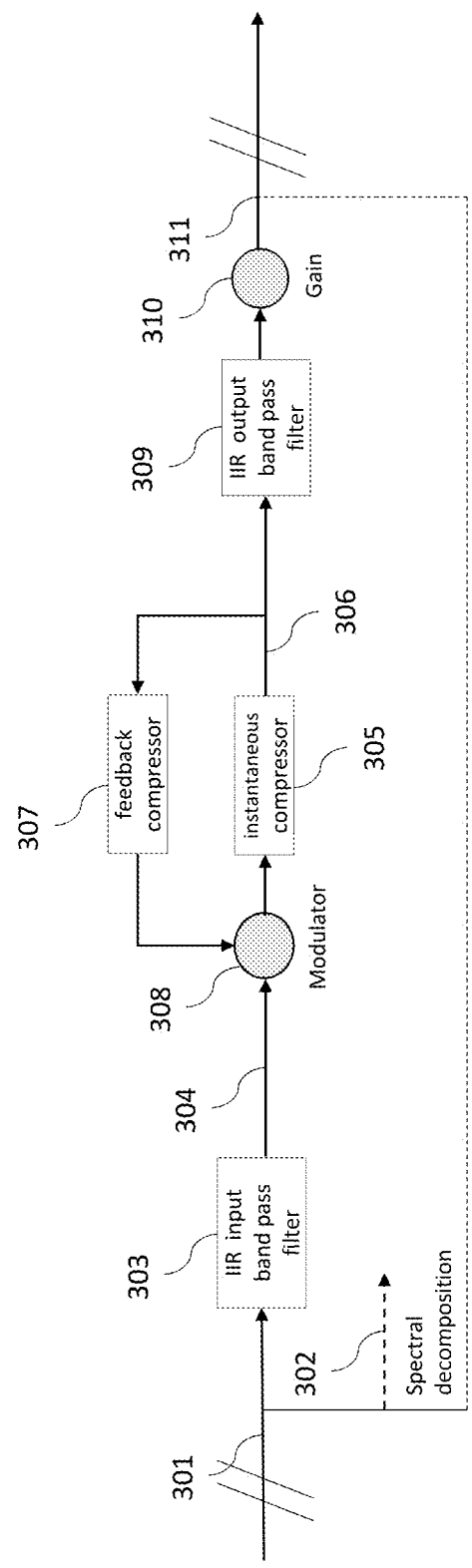
FIG. 3 illustrates a prior art hearing aid circuit.

This healthy hearing model formed the basis of Meddis et al.'s "BioAid-algorithm", as illustrated in FIG. 3. At first, the audio signal is provided at a control input 301, which is then spectrally decomposed 302 into a plurality of frequency bands by the input band pass filter 303 (which is an infinite impulse response (IIR) filter that is recursive, and, thus, introduces phase distortion). Each frequency band is processed in the schematically shown plurality of parallel channels having all the same operators, though different parameters to it. Each respective frequency band is provided at a compression input 304, which is feed forward compressed by an instantaneous dynamic range compressor 305 (with time constant zero). From the compression output 306, the audio signal is processed by a feedback DRC 307, wherein the feedback DRC 307 is delayed relative to the instantaneous DRC 305. Subsequently, the compressed audio signal is modulated via a modulator 308 to attenuate the audio signal provided to the instantaneous, feedforward DRC.

The delayed feedback DRC processing is characterized by two adjustable parameters: a threshold parameter and a strength parameter. The threshold parameter specifies the level of the output from the instantaneous, feedforward DRC, at which the feedback processing starts to work. The strength parameter, which governs the amount of attenuation applied when the feedback processing is active, is a scalar that is multiplied by the ratio of the input to the feedback-processing process relative to the feedback processing threshold in dB (thus giving the attenuation values in dB).

This compressed audio signal from the compression output 306 is passed through an output IIR band pass filter 309 to control the spectral spread of distortion. This secondary IIR filter 309 has the same pass-band as the input IIR band pass filter 303. Subsequently, the compressed frequency bands are modulated by a gain 310 and, finally, recombined in an operator 311 to form a full wide band audio signal again to be provided at the control output.

Figure 6:
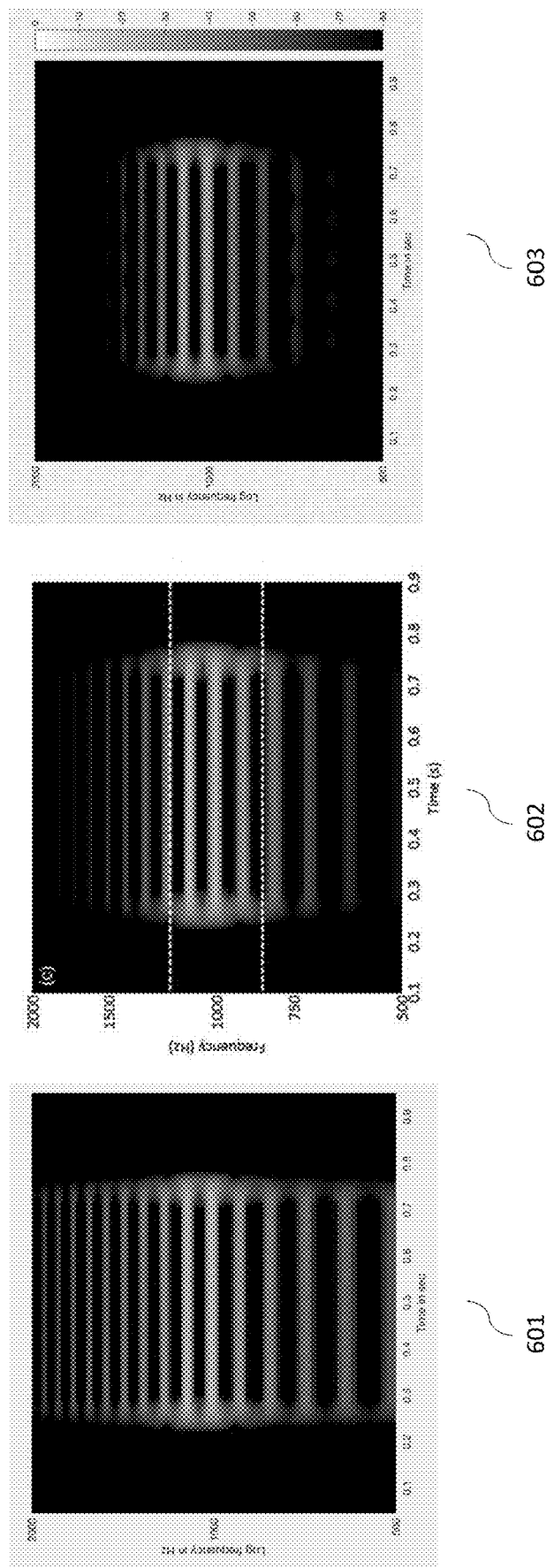
FIG. 6 illustrates a spectrogram in which frequency distortion is reduced using the configuration of FIG. 5.

As discussed previously, this algorithm has drawbacks on the subjective hearing experience caused by the use and arrangement of IIR filters 303, 309 and the instantaneous DRC 305. This configuration leads to an unconstrained spread of audible distortion, leading to a negative impact on perceived quality, particularly for users with milder forms of hearing loss (see e.g. FIG. 6,8). The algorithm was designed as a hearing aid algorithm to aid hard of hearing listeners in real world use cases (e.g. speech in noise), and thus would be a poor model for personalizing audio content. To this extent, it is the object of the invention to improve the objective and subjective listening experiences for a broad array of NH and HI listeners.

Figure 4:
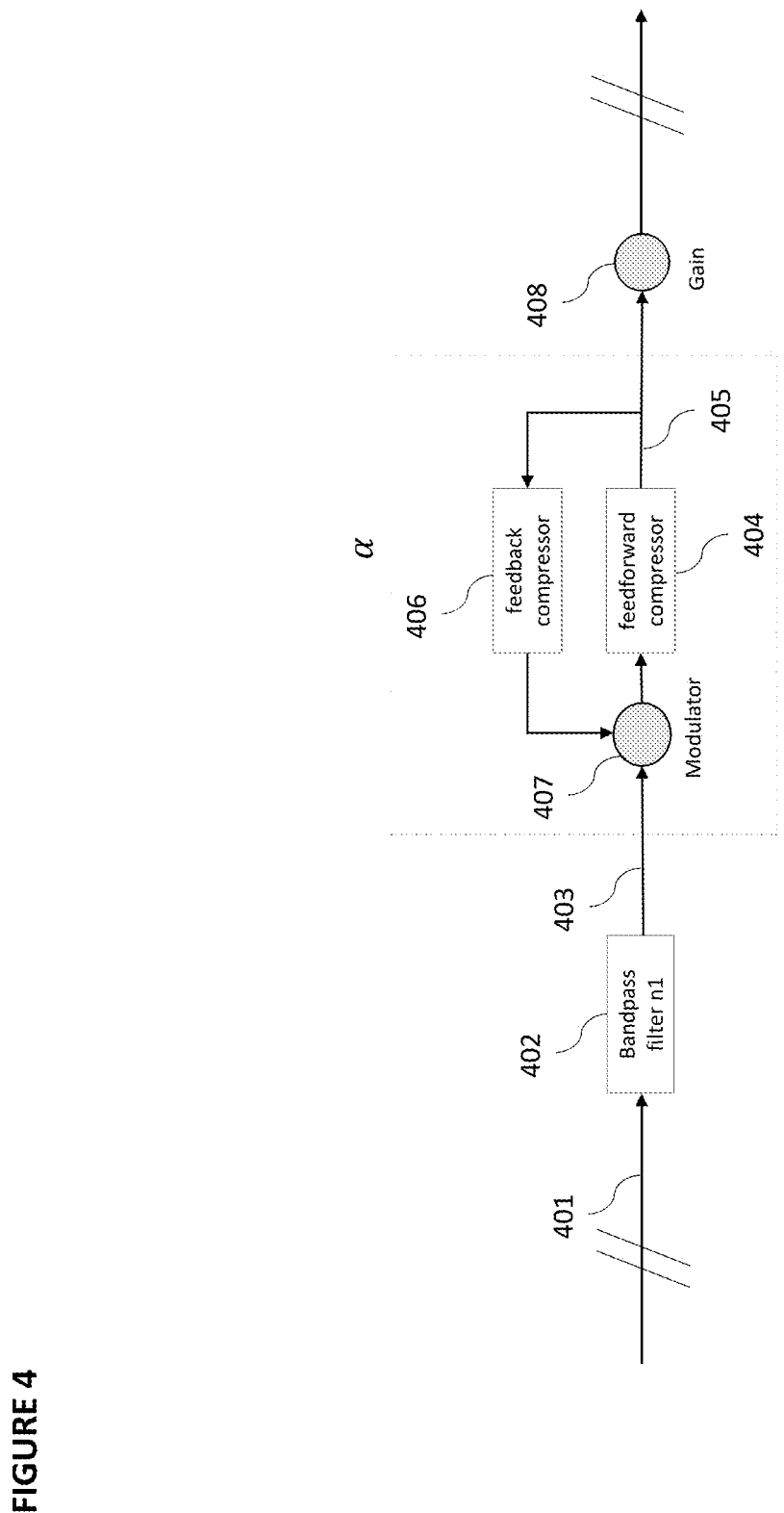
FIG. 4 illustrates the core digital signal processing circuit inspired by the basilar membrane and the medial olivocochlear complex.
Figure 5:
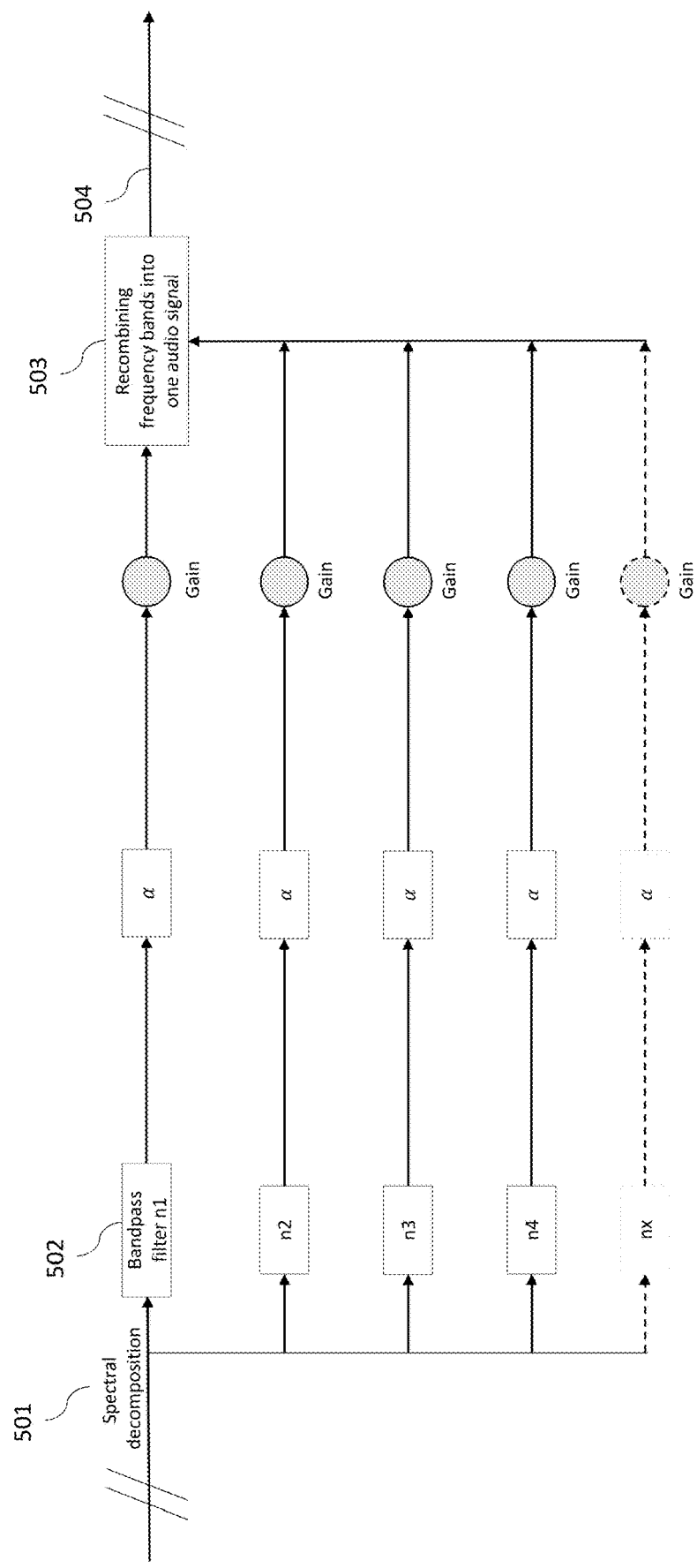
FIG. 5 illustrates an example embodiment in which the signal is spectrally decomposed, parallelly compressed and recombined.

In FIGS. 4 and 5, an example embodiment of the invention is illustrated. A wide band audio signal is provided at processing input 401 and then spectrally decomposed 501 into a plurality of frequency bands (e.g., into a plurality of subband signals, each subband signal in a respective frequency band). Spectral decomposition may be performed by the input band pass filter 402, 502, for example. Each frequency band may have a respective center frequency $f_0$, as well as a lower cutoff frequency and/or an upper cutoff frequency.

Each respective frequency band is provided at a compression input 403, which is feed forward compressed by feedforward DRC 404. Feedforward DRC 404 (or the dynamic range compression that is applied by the DRC 404) is slowed relative to an instantaneous DRC. This slowing may be direct or indirect. Indirectly slowing a feedforward compression can be achieved through means other than adjusting a DRC's attack and/or release time constants. This may occur through the use of a finite impulse response filter followed by signal oversampling, which has the net effect of slowing down feedforward compression relative to an instantaneous DRC. In this case, the compressed frequency bands are downsampled, e.g. to the original sample rate and/or sufficient rate for further processing and sound quality. This technique not only improves algorithmic computational efficiency—but further provides the opportunity to parameterize the spread of distortion independently from the analysis bandwidth. In another embodiment, feedforward DRC 404 is slowed directly through adjusting DRC 404's attack and/or release time constants. This slowed compression, in both cases, results in the reduction of the spectral spread of harmonic distortion and intermodulation distortion products relative to the prior art.

A time constant $\tau$ for direct slowing of the feedforward DRC 404 may be determined based on a range of frequencies that are subjected to the signal processing, e.g., the range of frequency bands output by the spectral decomposition. In some embodiments, this range may extend from 60 Hz to 20 kHz. The time constant $\tau$ for a corresponding frequency f is given by $\tau=1/(2\pi f)$. Thereby, the range of the frequency bands can be translated into a range for the time constant $\tau$ for direct slowing of the feedforward DRC 404. For the example of a range of frequencies extending from 60 Hz zo 20 kHz, a corresponding range for the time constant $\tau$ would extend from about 0.008 ms to about 2.65 ms. Thus, in some embodiments the range for the time constant $\tau$ may be chosen to extend from 0.01 ms to 3 ms. The actual time constant $\tau$ that is then used for direct slowing of the feedforward DRC 404 may be chosen from the range(s) for the time constant. The attack time constant and/or the release time constant for directly slowing the feedforward DRC 404 may be calculated from the selected time constant $\tau$, e.g., in the manner described in Fred Floru, Attack and Release Time Constants in RMS-Based Compressors and Limiters, 99$^{th}$ AES Convention, 6-9 Oct. 1999.

Notably, the above range for the time constant $\tau$ is compatible with typical update rates of the parameters of the feedforward DRC 404. For example, updating the feedforward DRC 404 every 64 samples for sampling rates of 44,100 Hz and 48,000 Hz will yield update intervals of 1.45 ms and 1.33 ms, respectively, which fall into the above range for the time constant $\tau$.

In some embodiments, the time constant $\tau$ for slowing of the feedforward DRC 404 in a given frequency band may depend on a frequency f within the respective frequency band. For example, the frequency f may be chosen to be a characteristic frequency $f_c$ of the RC filter (e.g., high-pass, low-pass, or bandpass filter) for the respective frequency band. This characteristic frequency $f_c$ may be, for example, the lower cutoff frequency, the upper cutoff frequency, or the center frequency of the RC filter (or likewise, the lower cutoff frequency, the upper cutoff frequency, or the center frequency of the respective frequency band). Again, the time constant $\tau$ for the given frequency band can be determined via $\tau=1/(2\pi f)$ or $\tau=1/(2\pi f_c)$ and the attack time constant and/or the release time constant for directly slowing the feedforward DRC 404 may be calculated from the time constant $\tau$, e.g., in the manner described in Fred Floru, Attack and Release Time Constants in RMS-Based Compressors and Limiters, 99$^{th}$ AES Convention, 6-9 Oct. 1999. In some embodiments, the time constant may be the RC time constant of the RC filter, $\tau=RC$.

As noted above, indirect slowing of the feedforward DRC 404 may involve signal oversampling by a factor N (e.g., 128, 256, 512, etc.). For example, the signal processing may be performed in the FFT domain, after applying an n-point FFT (e.g., 256 point FFT or 512 point FFT). The n-point FFT may be applied in each frequency band, for example, or the spectral decomposition may operate in the FFT domain. The transforms in each frequency band may then be overlapped by n/N samples (e.g., by 2 samples for a 256 point FFT and an oversampling rate of N=128). This means that a rate N times higher than the theoretical (sub-band) sample rate is used. However, this rate is still by a rate of n/N slower than the full data rate in the respective frequency band. This relative slowness means that the feedforward DRC 404 behaves like a full-rate instantaneous DRC with attack and release time constants applied. Incidentally, applying the n-point FFT drastically reduces the sample rate (e.g., in each frequency band) and thereby also allows for significant processing savings over a time domain implementation. For a given n, the oversampling rate N may range from 2 to n/2, for example (which translates into an overlap in the range between n/2 samples and 2 samples). For typical implementations (e.g., n=256, 512, 1024), the oversampling rate N may be in the range from 128 to 512, for example.

As noted above, slowing the first DRC relative to the instantaneous DRC may relate to both oversampling the respective subband signal as well as to increasing attack and/or release time constants of the first DRC (i.e., setting the attack and/or release time constants to values different from 0). One of ordinary skill in the art may appreciate that slowing the first DRC may be achieved through the combination of both indirect slowing (i.e. oversampling) and direct slowing (i.e. altering the time constants of the first DRC). For direct slowing, $\tau$ is related to the cutoff frequency $f_c$, an alternative parameter of the RC circuit, by $\tau=RC=1/(2\pi f_c)$. An (indirect) equivalent of the time constant $\tau$ of the directly slowed first DRC for the slowing by oversampling can be calculated by dividing the oversampling rate N by the sampling rate (e.g. 44100 Hz). To this extent, the combinatorial effect of indirect and direct slowing of the DRC is readily calculable as a function of these two values.

Figure 8:
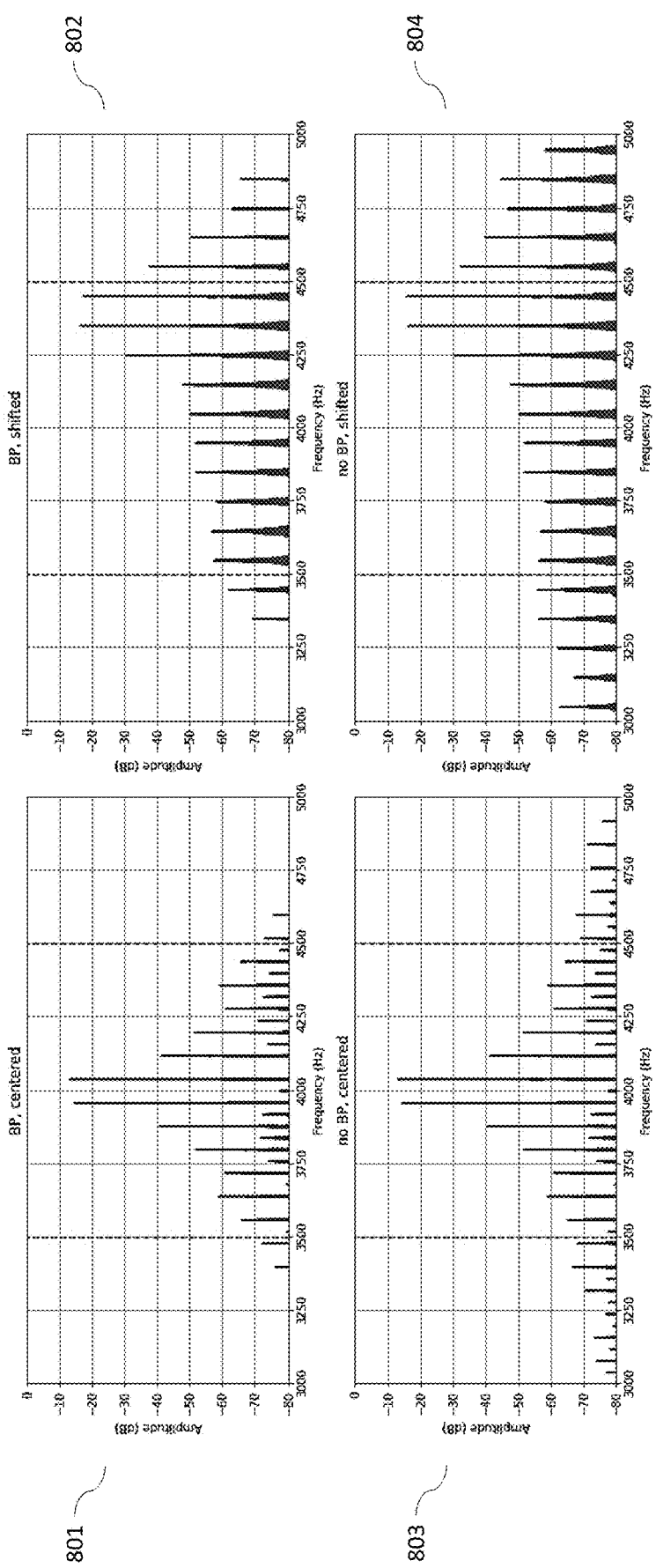
FIG. 8 illustrates distortion patterns from two compressed test signals; when the test signals are shifted closer to the hypothetical edge of a band pass filter, the distortion pattern is more symmetrical when an output band pass filter is not employed.

Importantly, slowing the feedforward DRC 404 also replaces the need for having output band pass filter 309—which results in a more symmetrical distribution of the harmonic distortion that remains. In the healthy hearing system, natural distortion emanates symmetrically at all frequency regions of the basilar membrane as the cochlear process, in itself, can be thought of as a resonant system with a continuum of changing properties. As seen in FIG. 8, when the distortion pattern of a given frequency is moved towards one of the band edges of an output band pass filter, see panels 802, 803, the distortion pattern is asymmetrically curtailed, see panel 802. When an output band pass filter is not present, harmonic symmetry is better retained—thus better emulating the natural distortion creating by the basilar membrane.

From the compression output 405, the audio signal is processed by a feedback DRC 406. The feedback DRC 406 is delayed relative to the feedforward DRC. The feedback pathway is tapped from the output of the feedforward DRC process. The feedback pathway may be attenuated by thresholding to obtain signal parts above a certain threshold. This signal may then be low-pass filtered for temporal smoothing and may be multiplied by a scalar factor. The aforementioned delay may be achieved through the use of a buffer, such as a ring buffer, for example. This results in a stream of attenuation values that by their delays simulate the synaptic delays of the MOC feedback system. This stream of values is subsequently used to modulate the audio signal provided to the feedforward DRC 404 within each band. Modulation, feedforward compression and feedback compression proceed in a continuous manner. Thus, the feedback loop dynamically adapts compression to the audio signal level, enabling more effective mitigation of off-frequency sound masking—a process that physiologically occurs in the auditory system.

Frequency bands may be modulated by a gain 408 and, finally, recombined in operator 503 to form a full wide audio band signal again to be provided at the control output 504. Each frequency band may have its own, distinct parameters, e.g. gain, attenuation factors, etc.

Figure 9:
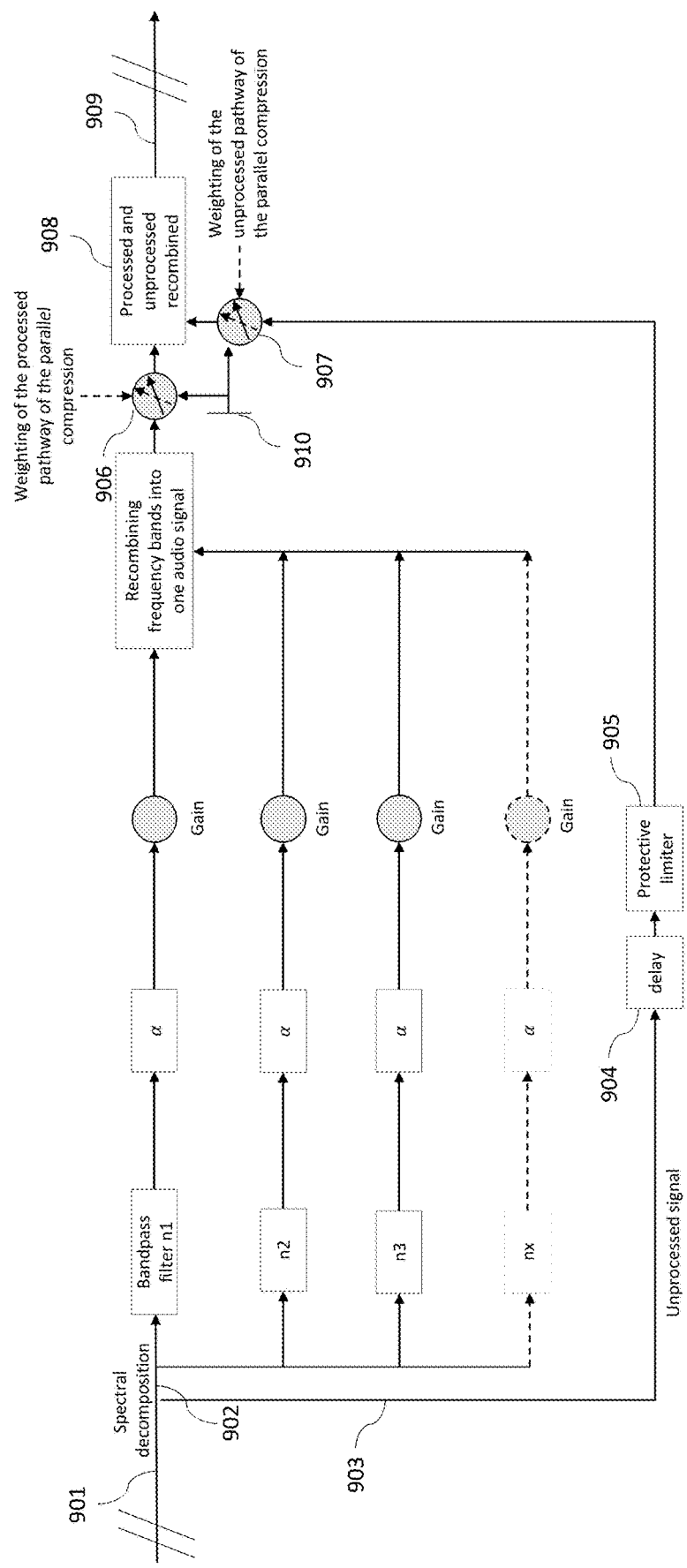
FIG. 9 illustrates a further embodiment in which the signal is divided into a first signal pathway and a second signal pathway (a processed and an unprocessed pathway), and subsequently recombined at a user defined ratio.

Another example embodiment of the invention is illustrated in FIG. 9, in which sound processed according the configuration of FIGS. 4, 5 is split into a first and second signaling pathway (or signal pathway). Specifically, a wide band audio signal is provided at processing input 901 and then divided into a first pathway (first signal pathway) 902 and a second pathway (second signal pathway) 903. In this example, the second pathway 903 is only subject to a delay 904 and a protective limiter 905. In contrast, in the first pathway 902, the audio signal from the control input 901 is spectrally decomposed and processed according to the configuration of FIG. 4. Each pathway 902, 903 may include a weighting operator 906 and 907, respectively. For example, these weighting operators 906 and 907 may be correlated by a common function that may be adjustable by a user by one single control variable 910. Then these pathways 902 and 903 are recombined according to their weighting factors in operator 908 and provided to the processing output 909.

Parallel compression provides the benefit of allowing the user to mix 'dry' unprocessed or slightly processed sound with 'wet' processed sound, enabling customization of processing based on subjective preference. For example, this enables hearing impaired users to use a high ratio of heavily processed sound relative to users with moderate to low hearing loss. Furthermore, by reducing the dynamic range of an audio signal by bringing up the softest sounds, rather than reducing the highest peaks, it provides audible detail to sound. The human ear is sensitive to loud sounds being suddenly reduced in volume, but less sensitive to soft sounds being increased in volume, and this mixing method takes advantage of this observation, resulting in a more natural sounding reduction in dynamic range compared with using a dynamic range compressor in isolation. Additionally, parallel compression is in particular useful for speech-comprehension and/or for listening to music with full, original timbre.

To mix two different signal pathways requires that the signals in the pathways conform to phase linearity, or into the pathway's identical phase using phase distortion, or the pathway mixing modulator involves a phase correction network in order to prevent any phase cancellations upon summing the correlated signals to provide an audio signal to the control output. Notably, parallel compression is problematic using the approach in the prior art as the recursive input and output IIR band pass filters introduce phase distortion into the audio signal. Superposition of a phase-distorted signal with a similar audio signal can cause so-called comb-filtering effects, which adversely affects the timbral quality of the results. Users are sensitive to these effects, which are detrimental to the subjective hearing experience.

Figure 10:
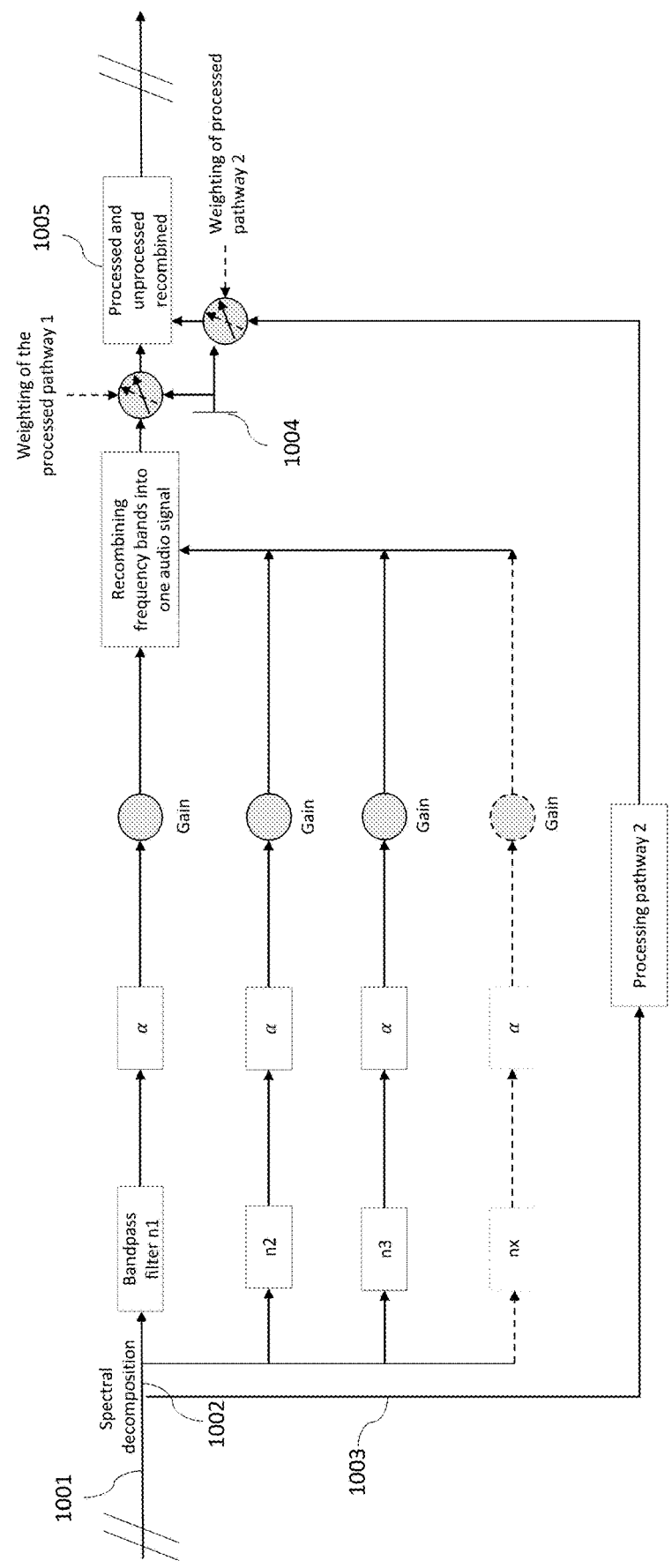
FIG. 10 Illustrates a further embodiment in which the signal is divided into a first signal pathway and a second signal pathway, and subsequently recombined at a user defined ratio.

A further example embodiment of the invention is illustrated in FIG. 10, in which a wide band audio signal is provided at processing input 1001 and then divided into a first processed pathway 1002 (first signaling pathway, or first signal pathway), utilizing the same processing configuration as FIG. 3, and a second processed pathway 1003 (first signaling pathway, or first signal pathway). Similar to the configuration in FIG. 9, the phases of each processed pathway must be in sync in order to prevent phase cancellation and comb-filtering effects. The second processed pathway 1003 may include, for instance, a sound enhancing algorithm, such as a speech-comprehension algorithm, to allow the user to adjust pathway ratios to allow for better speech comprehension and/or to have a subjectively more comfortable music hearing experience for the user in a respective background noise environment. A further example could also include a differently parameterized process using the configuration illustrated in FIG. 4. Generally, any sound processing algorithm, such as a hearing aid algorithm, preferably having linear phase characteristics, could be mixed with the first processed pathway 1002. The two processed pathways have to be in line with one of the following rules. The signals in each pathway must either (i) conform to phase linearity, (ii) introduce identical phase distortions, or (iii) involve a phase correction network in order to prevent any phase cancellations upon summing the correlated signals to form the output. Preferably, option (i) or option (ii) is implemented as this allows for lean and simple implementation.

Figure 11:
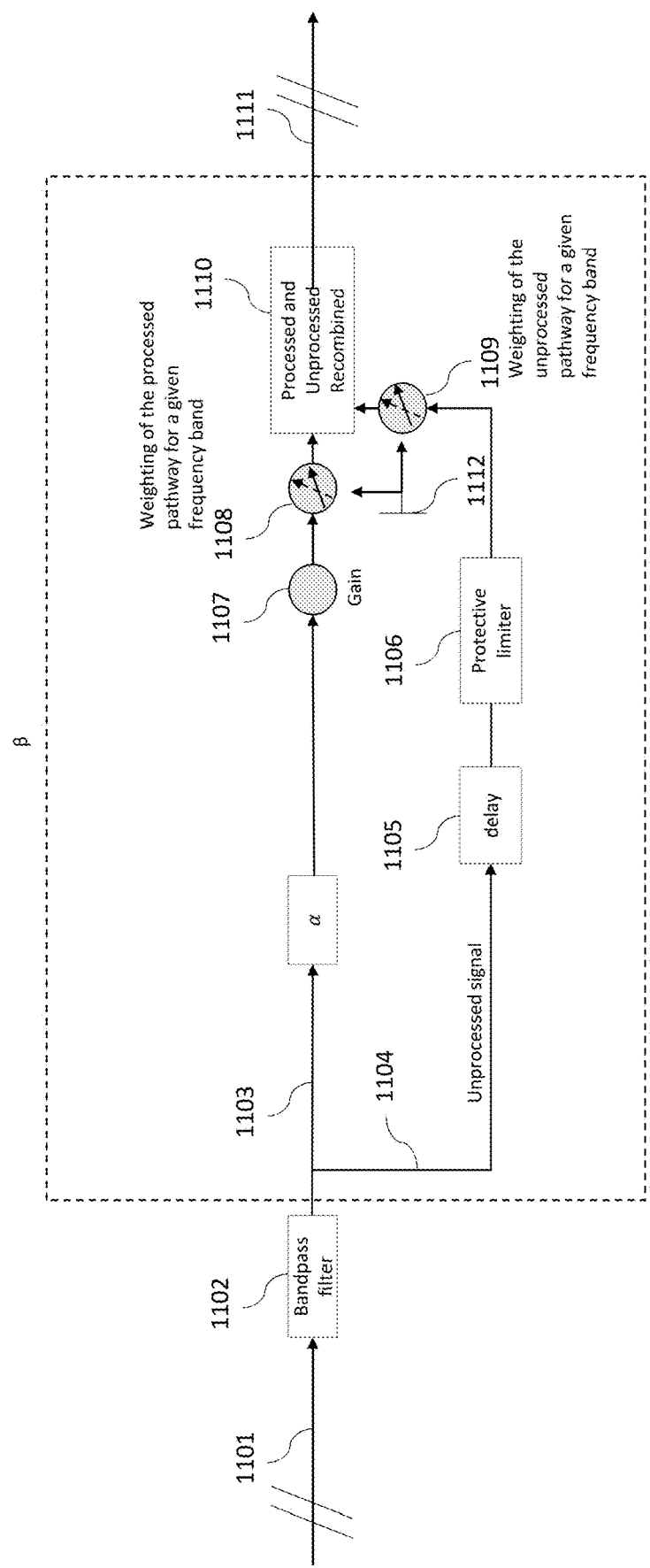
FIG. 11 illustrates an additional embodiment, in which the signal is divided into a first signal pathway and a second signal pathway in each frequency band, which can be subsequently recombined at various user defined ratios according to the frequency band.
Figure 12:
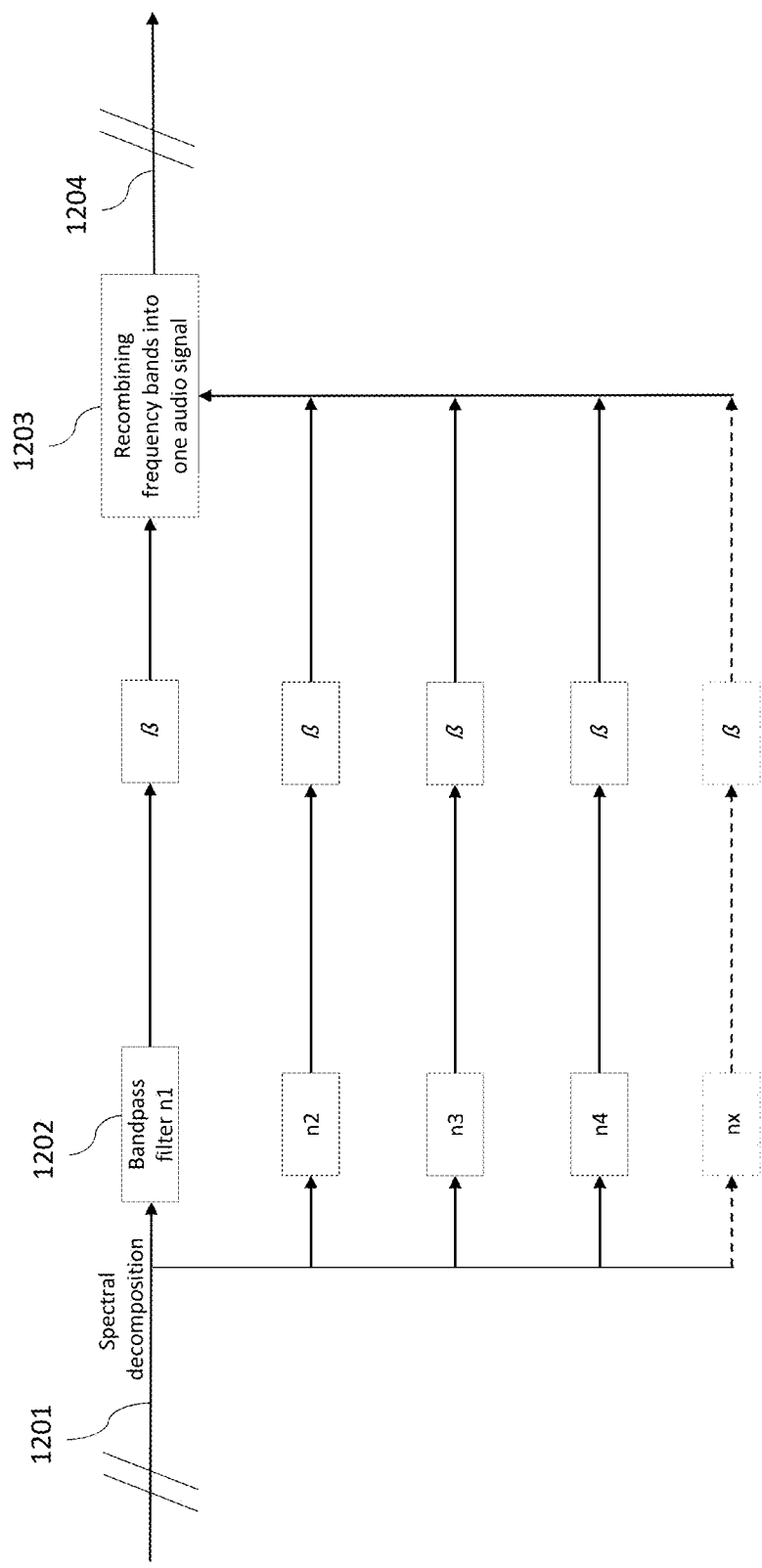
FIG. 12. illustrates a broader example of using the technique of using the structure of FIG. 11 in a spectrally decomposed audio signal.

A further example embodiment of the invention is illustrated in FIGS. 11 and 12, in which a wide band audio signal is provided at processing input 1101, 1201 and then spectrally decomposed into a plurality of frequency bands (e.g., into a plurality of subband signals, each subband signal in a respective frequency band). Spectral decomposition may be performed by the input band pass filter 1202, for example. Each respective frequency band (e.g., subband signal) is divided into a first pathway (first signal pathway) 1103 and a second pathway (second signal pathway) 1104. In this example, the second pathway 1104 is lightly processed as it only includes a delay 1105 and a protective limiter 1106. In contrast, first pathway 1103 is processed similarly to the configuration illustrated in FIG. 5. Namely, the first pathway frequency band is provided at a compression input, which is feed forward compressed by feedforward DRC 404. From the compression output, the audio signal is processed by a feedback DRC 406, wherein the feedback DRC 406 may be delayed relative to the feedforward DRC 404. That is, the output of the feedback processing pathway may be deliberately delayed, e.g. by a delay element (such as a buffer, for example). The delay may be inserted before or after the feedback DRC. Subsequently, the compressed audio signal may be modulated via a modulator 407 to attenuate the audio signal provided to feedforward DRC 404. The compressed frequency bands may then be modulated by a gain 408, 1107. First and second frequency band pathways may include a weighting operator 1108 and 1109, respectively. Here, these weighting operators 1108 and 1109 may be correlated by a common function that may be adjustable by a user by one single control variable 1112. Then these pathways 1103 and 1104 are recombined according to their weighting factors in operator 1110 and provided to the processing output 1111. Finally, the frequency bands (e.g., subband signals) are recombined in operator 1203 to form a full wide audio band signal again to be provided at the control output 1204. The configuration of FIGS. 11 and 12 importantly allows the user much more control over which frequencies are processed in the audio spectrum of a signal. For instance, in a music composition with intense treble, it may be preferable to process sounds across a higher frequency range. Conversely, while focusing on human speech, approximately around 150 Hz-4 kHz, processing may focus on narrower spectra. Generally, spectral processing can be adjusted for computational savings purposes.

Figure 13:
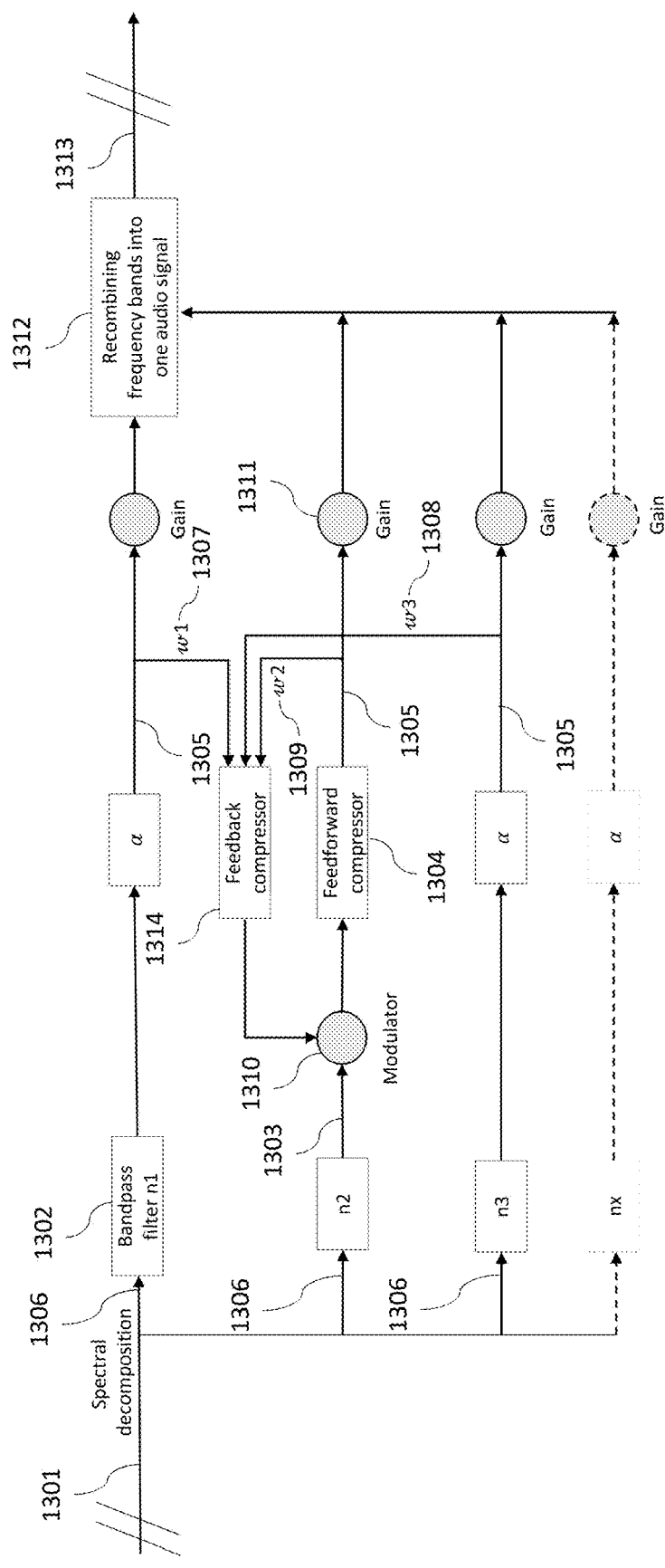
FIG. 13. Illustrates an example wherein the control signal in the feedback DRC may include weighted versions of the same signal in neighboring frequency bands.

A further example embodiment of the invention is illustrated in FIG. 13. A wide band audio signal is provided at processing input 1301 and then spectrally decomposed into a plurality of frequency bands (e.g., into a plurality of subband signals, each subband signal in a respective frequency band). Spectral decomposition may be performed by the input band pass filter 1302, for example. Each respective frequency band is provided at a compression input 1303, which is feed forward compressed by feedforward DRC 1304. Feedforward DRC 1304 is slowed relative to an instantaneous DRC. This may occur directly or indirectly, e.g., in the manner described above. From the compression outputs 1305 of a plurality of frequency bands 1306, wherein each compression output from a respective frequency band is assigned an individual weighting 1307, 1308, 1309, the respective audio signals are processed by feedback compression 1314. Although FIG. 13 shows the feeding of weighted feedforward compressed audio signals from neighboring frequency bands for a single frequency band only, it is understood that feedback compression in each frequency band may receive weighted feedforward compressed audio signals as inputs from respective neighboring frequency bands. The feedback DRC 1314 may be delayed relative to the feedforward DRC 1304. That is, the output of the feedback DRC may be deliberately delayed, e.g., by a delay element (such as a buffer for example). The delay may be inserted before or after the feedback DRC. The plurality of delayed feed-back compressed audio signals may be modulated via a modulator 1310 to attenuate the audio signal provided to feedforward DRC 1304. The compressed frequency bands may then be modulated by a gain 1311 and, finally, recombined in operator 1312 to form a full wide audio band signal again to be provided at the control output 1313. The ability to attenuate the audio signal in a given frequency band as a function that includes signal levels in one or more neighboring frequency bands, provides a more refined degree of parameterization for an augmented hearing experience. Moreover, this process happens naturally in the olivocochlear system in the ear (Effects of electrical stimulation of efferent olivochoclear neurons on cat auditory-nerve fibers. III, Tuning curves and thresholds at CF, Guinan & Gifford, 1988)—and thus this audio processing configuration more closely models healthy hearing in the auditory stem.

Figure 14:
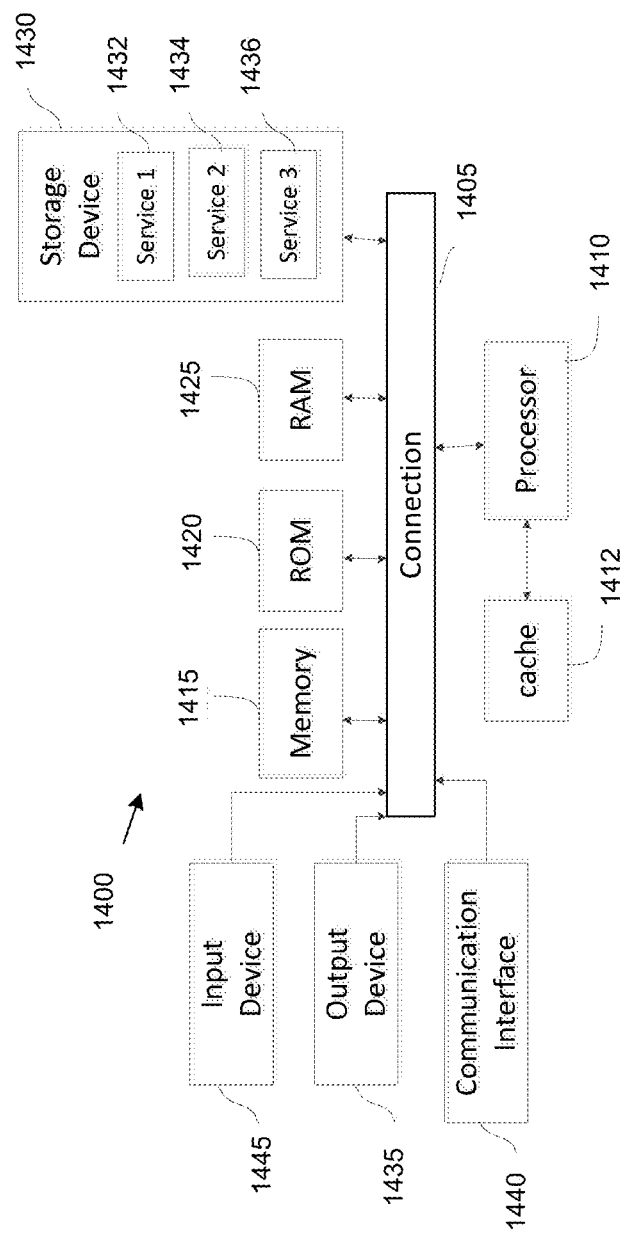
FIG. 14 shows an example of a system for implementing certain aspects of the present technology.

FIG. 14 shows an example of computing system 1400 (e.g., audio device, smart phone, etc.) in which the components of the system are in communication with each other using connection 1405. Connection 1405 can be a physical connection via a bus, or a direct connection into processor 1410, such as in a chipset architecture. Connection 1405 can also be a virtual connection, networked connection, or logical connection.

In some embodiments computing system 1400 is a distributed system in which the functions described in this disclosure can be distributed within a datacenter, multiple datacenters, a peer network, etc. In some embodiments, one or more of the described system components represents many such components each performing some or all of the function for which the component is described. In some embodiments, the components can be physical or virtual devices.

Example system 1400 includes at least one processing unit (CPU or processor) 1410 and connection 1405 that couples various system components including system memory 1415, such as read only memory (ROM) and random access memory (RAM) to processor 1410. Computing system 1400 can include a cache of high-speed memory connected directly with, in close proximity to, or integrated as part of processor 1410.

Processor 1410 can include any general-purpose processor and a hardware service or software service, such as services 1432, 1434, and 1436 stored in storage device 1430, configured to control processor 1410 as well as a special-purpose processor where software instructions are incorporated into the actual processor design. Processor 1410 may essentially be a completely self-contained computing system, containing multiple cores or processors, a bus, memory controller, cache, etc. A multi-core processor may be symmetric or asymmetric.

To enable user interaction, computing system 1400 includes an input device 1445, which can represent any number of input mechanisms, such as a microphone for speech, a touch-sensitive screen for gesture or graphical input, keyboard, mouse, motion input, speech, etc. In some examples, the input device can also include audio signals, such as through an audio jack or the like. Computing system 1400 can also include output device 1435, which can be one or more of a number of output mechanisms known to those of skill in the art. In some instances, multimodal systems can enable a user to provide multiple types of input/output to communicate with computing system 1400. Computing system 1400 can include communications interface 1440, which can generally govern and manage the user input and system output. In some examples, communication interface 1440 can be configured to receive one or more audio signals via one or more networks (e.g., Bluetooth, Internet, etc.). There is no restriction on operating on any particular hardware arrangement and therefore the basic features here may easily be substituted for improved hardware or firmware arrangements as they are developed.

Storage device 1430 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read only memory (ROM), and/or some combination of these devices.

The storage device 1430 can include software services, servers, services, etc., that when the code that defines such software is executed by the processor 1410, it causes the system to perform a function. In some embodiments, a hardware service that performs a particular function can include the software component stored in a computer-readable medium in connection with the necessary hardware components, such as processor 1410, connection 1405, output device 1435, etc., to carry out the function.

For clarity of explanation, in some instances the present technology may be presented as including individual functional blocks including functional blocks comprising devices, device components, steps or routines in a method embodied in software, or combinations of hardware and software.

The presented technology creates improved, biologically-inspired DSP algorithms that more closely mimic the functional processing of the healthy human ear. The invention avoids the limitations inherent in prior art DSP methodologies, namely unconstrained frequency distortion and phase distortion. To this extent, the invention provides an enhanced listening experience both to hard of hearing individuals as well as individuals with healthy hearing, who experience a richer, crisper listening experience of audio content.

Further example embodiments of the disclosure are summarized in the Enumerated Example Embodiments (EEEs) listed below.

A first EEE relates to a method for processing an audio signal for replay on an audio device, the method comprising: a) performing a spectral decomposition of the audio signal (501) into a plurality of subband signals using a band pass filter (402, 502); b) for each subband signal, providing the subband signal to a respective modulator (407) and from the modulator output, providing the subband signal to a respective first processing path that includes a first dynamic range compressor, DRC (404); c) for each subband signal, feedforward compressing the subband signal by the respective first DRC (404) to obtain a feedforward-compressed subband signal; d) for each subband signal, providing the feedforward-compressed subband signal to a second processing path that includes a second DRC (406), compressing the feedforward-compressed subband signal by the respective second DRC (406), and providing an output of the second processing path to the respective modulator (407), wherein modulating the subband signal by the respective modulator (407) is performed in dependence on the output of the second processing path; and e) recombining the feedforward-compressed subband signals, wherein feedforward compressing comprises, for each subband signal, slowing the respective first DRC (404) relative to an instantaneous DRC.

A second EEE relates to a method of processing an audio signal for replay on an audio device, the method comprising dividing an unprocessed audio signal into a first signal pathway (903, 1003) and a second signal pathway (902, 1002), processing the audio signal in the first signal pathway (902, 903), and recombining outputs of the first and second signal pathways (902/903, 1002/1003) at a ratio (910, 1004), wherein the processing in the first signal pathway (902, 1002) comprises: a) performing a spectral decomposition of the audio signal (501) into a plurality of subband signals using a band pass filter (402, 502); b) for each subband signal, providing the subband signal to a respective modulator (407) and from the modulator output, providing the subband signal to a respective first processing path that includes a first dynamic range compressor, DRC (404); c) for each subband signal, feedforward compressing the subband signal by the respective first DRC (404) to obtain a feedforward-compressed subband signal; d) for each subband signal, providing the feedforward-compressed subband signal to a second processing path that includes a second DRC (406), compressing the feedforward-compressed subband signal by the respective second DRC (406), and providing an output of the second processing path to the respective modulator (407), wherein modulating the subband signal by the respective modulator (407) is performed in dependence on the output of the second processing path; and e) recombining the feedforward-compressed subband signals, wherein feedforward compressing comprises, for each subband signal, slowing the respective first DRC (404) relative to an instantaneous DRC.

A third EEE relates to the method of the second EEE, wherein the ratio (910, 1004) is a user-defined ratio.

A fourth EEE relates to the method according to the second or third EEEs, wherein the second signal pathway (903) features a delay and the delayed signal is subjected to a protective limiter.

A fifth EEE relates to the method according to EEEs 2-4, wherein frequencies only between 125 Hz and 12,000 Hz are processed in the first signal pathway (902, 1002).

A sixth EEE relates to a method for processing an audio signal for replay on an audio device, the method comprising: a) performing a spectral decomposition (1202) of the audio signal into a plurality of subband signals using a band pass filter (1102, 1202); b) for each subband signal, dividing the subband signal into a first signal pathway (1103) and a second signal pathway (1103), processing the subband signal in the first signal pathway (1103), and recombining the first and second signal pathways (1103, 1104) at a ratio to obtain a processed subband signal; and c) recombining the processed subband signals, wherein, for each subband signal, the processing of the subband signal in the first signal pathway (1103) comprises: b1) providing the subband signal to a respective modulator (407) and from the modulator output, providing the subband signal to a respective first processing path that includes a first dynamic range compressor, DRC (404); b2) feedforward compressing the subband signal by the respective first DRC (404) to obtain a feedforward-compressed subband signal; and b3) providing the feedforward-compressed subband signal to a second processing path that includes a second DRC (406), compressing the feedforward-compressed subband signal by the respective second DRC (406), and providing an output of the second processing path to the respective modulator (407), wherein modulating the subband signal is performed in dependence on the output of the second processing path, and wherein feedforward compressing comprises, for each subband signal, slowing the respective first DRC (404) relative to an instantaneous DRC.

A seventh EEE relates to the method accord to the sixth EEE, wherein the second signal pathway (1104) features a delay and the delayed signal is subjected to a protective limiter.

An eighth EEE relates to a method for processing an audio signal for replay on an audio device, the method comprising: a) performing a spectral decomposition (1302) of the audio signal into a plurality of subband signals using a band pass filter; b) for each subband signal, providing the subband signal to a respective modulator (407) and from the modulator output, providing the subband signal to a respective first processing path that includes a first dynamic range compressor, DRC (1304); c) for each subband signal, feedforward compressing the subband signal by the respective first DRC (1304) to obtain a feedforward-compressed subband signal; d) for each subband signal, providing the feedforward-compressed subband signal to a second processing path that includes a second DRC (1314) and further providing one or more feedforward-compressed subband signals from neighboring frequency bands, each weighted with a respective weighting factor, to the second processing path, compressing, in the second processing path, the feedforward-compressed subband signal and the weighted feedforward-compressed subband signals from the neighboring frequency subbands by the respective second DRC (1314), and providing an output of the second processing path to the respective modulator, wherein modulating the subband signal is performed in dependence on the output of the second processing path; and e) recombining the feedforward-compressed audio signals, wherein feedforward compressing comprises, for each subband signal, slowing the respective first DRC (1304) relative to an instantaneous DRC.

A ninth EEE relates to a method according to any of the preceding EEE's, further comprising, for each subband signal, delaying the output of the respective second processing path (406).

A tenth EEE relates to a method according to any of the preceding EEE's, wherein, for each subband signal, the output of the respective second processing path is delayed by a delay amount that is in the interval from 5 ms to 20 ms.

An eleventh EEE relates to a method according to any of the preceding EEE's, wherein the band pass filter (402, 502) is phase linear.

A twelfth EEE relates to a method according to any of the preceding EEE's, wherein the band pass filter (402, 502) is a finite impulse response filter operating in the frequency domain.

A thirteenth EEE relates to a method according to any of the preceding EEE's, wherein the first DRC (404) is slowed by multi-rate signal processing as part of the spectral decomposition process.

A fourteenth EEE relates to a method according to any of EEE's 1-12, wherein the first DRC (404) is slowed by changing the attack and/or release time constants of the first DRC (404).

A fifteenth EEE relates to a method according to any of the preceding EEE's, wherein the audio device is one of: a mobile phone, a tablet, a computer, a television, a pair of headphones, a hearing aid or a speaker system.

A sixteenth EEE relates to a method according to any of the preceding EEE's, wherein only one bandpass filter is employed per frequency band.

A seventeenth EEE relates to an audio output device comprising: a processor for processing an audio signal according to the methods of any of the preceding EEE's.

An eighteenth EEE relates to a computer readable storage medium storing a program causing an audio output device to execute audio processing according to the methods of any of EEE's 1 to 16.

LIST OF REFERENCE NUMERALS

- 201 outer- and middle ear
- 202 filterbank
- 203 inner hair cell (IHC)
- 204 IHC synapse
- 205 auditory nerve
- 206 acoustic reflex
- 207 MOC reflex
- 208 brainstem
- 301 control input
- 302 spectral decomposition
- 303 IIR input band pass filter
- 304 compression input
- 305 instantaneous DRC
- 306 compression output
- 307 feedback DRC
- 308 modulator
- 309 IIR output band pass filter
- 310 gain
- 311 operator
- 401 control input
- 402 input bandpass filter
- 403 compression input
- 404 feedforward DRC
- 405 compression output
- 406 feedback DRC
- 407 modulator
- 408 gain
- 501 spectral decomposition
- 502 input bandpass filter
- 503 operator
- 504 control output
- 601 spectrogram-distortion from instantaneous compression (IC) output (1 kHz input)
- 602 spectrogram—distortion from IC output with input and output IIR band pass filters
- 603 spectrogram—distortion from DRC with input FIR band pass filter
- 701 Psychophysical tuning curve from a subject before and after exposure to algorithm according to claim 1—left ear
- 702 Psychophysical tuning curve from a subject before and after exposure to algorithm according to claim 1—right ear
- 801 Distortion going through a band pass filter—centered
- 802 Distortion going through a band pass filter—shifted from center
- 803 Distortion—no band pass filter—centered
- 804 Distortion—no band pass filter—shifted from center
- 901 Control input
- 902 Processed pathway
- 903 Unprocessed pathway
- 904 delay
- 905 protective limiter
- 906 processed pathway weighting operator
- 907 unprocessed pathway weighting operator
- 908 recombining the two pathways
- 909 control output
- 910 single control variable
- 1001 control input
- 1002 processed pathway 1
- 1003 processed pathway 2
- 1004 control variable
- 1101 control input
- 1102 input bandpass filter
- 1103 processed frequency band pathway
- 1104 unprocessed frequency band pathway
- 1105 delay
- 1106 protective limiter
- 1107 gain
- 1108 processed frequency band pathway weighting operator
- 1109 unprocessed frequency band pathway weighting operator
- 1110 single control variable
- 1111 control output
- 1201 control input
- 1202 input band pass filter
- 1203 recombining frequency bands
- 1204 control output
- 1301 control input
- 1302 input bandpass filter
- 1303 compression input of primary frequency band
- 1304 feedforward DRC
- 1305 feedback DRC
- 1306 alternate frequency bands
- 1307 weighting 1
- 1308 weighting 2
- 1309 weighting 3
- 1310 modulator
- 1311 gain
- 1312 recombining the frequency bands
- 1313 control output
- 1314 feedback DRC

The invention claimed is:

1. A method of processing an audio signal for replay on an audio device, the method comprising:
   performing a spectral decomposition of the audio signal into a plurality of subband signals using a band pass filter, where each subband signal is associated with at least one reference frequency f within the subband;
   for each given subband signal of the plurality of subband signals:
      providing the subband signal to a modulator and from the modulator output, providing the modulated subband signal to a first processing path that includes a first dynamic range compressor (DRC);
      feedforward compressing the modulated subband signal to obtain a feedforward-compressed subband signal, wherein:
         the feedforward compressing comprises directly slowing the first DRC relative to an instantaneous DRC by adjusting one or more of an attack time constant and a release time constant of the first DRC; and
         the adjusting of the attack time constant and/or the release time constant of the first DRC is based on a reference time constant τ that corresponds to the reference frequency f of the given subband signal;
      providing the feedforward-compressed subband signal to a second processing path that includes a second DRC, compressing the feedforward-compressed subband signal by the second DRC; and
      providing an output of the second processing path to the modulator, wherein modulating the feedforward-compressed subband signal by the modulator is performed in dependence on the output of the second processing path; and
   recombining the feedforward-compressed subband signals.

2. The method of claim 1, further comprising:
   dividing an unprocessed audio signal into a first signal pathway and a second signal pathway;
   processing the unprocessed audio signal in the first signal pathway; and
   recombining outputs of the first signal and second signal pathways at a ratio.

3. The method of claim 2, wherein the ratio is a user-defined ratio.

4. The method of claim 2, wherein the second signal pathway features a delay and the delayed signal is subjected to a protective limiter.

5. The method of claim 2, wherein frequencies between 60 Hz and 20,000 Hz are processed in the first signal pathway.

6. The method of claim 1, further comprising, for each subband signal of the plurality of subband signals:
   providing the feedforward-compressed subband signal to a second processing path that includes a second DRC;
   providing one or more feedforward-compressed subband signals from neighboring frequency bands, each weighted with a weighting factor, to the second processing path; and
   compressing, in the second processing path, the feedforward-compressed subband signal and the weighted feedforward-compressed subband signals from the neighboring frequency subbands by the second DRC.

7. The method of claim 2, further comprising, for each subband signal, delaying the output of the second processing path.

8. The method of claim 1, wherein, for each subband signal, the output of the second processing path is delayed by a delay amount that is in an interval from 5 ms to 20 ms.

9. The method of claim 1, wherein the band pass filter is a frequency domain finite impulse response filter.

10. The method of claim 1, wherein slowing the first DRC relative to the instantaneous DRC relates to oversampling the subband signal.

11. The method of claim 10, wherein the subband signal is oversampled by an oversampling rate N in a range from 128 to 512.

12. The method of claim 10, wherein the oversampling comprises applying an n-point FFT to the subband signal and overlapping the FFT transforms by n/N samples, where N is the oversampling rate and n is larger than N.

13. The method of claim 1, wherein slowing the first DRC relative to the instantaneous DRC relates to increasing attack and/or release time constants of the first DRC.

14. The method of claim 1, wherein slowing the first DRC relative to the instantaneous DRC relates to setting attack and/or release time constants of the first DRC based on a time constant τ that is selected from a range extending from 0.01 ms to 3 ms.

15. An audio output device comprising:
   at least one processor; and
   at least one memory storing instructions, which when executed causes the at least one processor to:
      perform a spectral decomposition of an audio signal into a plurality of subband signals using a band pass filter, where each subband signal is associated with at least one reference frequency f within the subband;
      for each given subband signal of the plurality of subband signals:
         provide the subband signal to a modulator and from the modulator output, providing the modulated subband signal to a first processing path that includes a first dynamic range compressor (DRC);
         feedforward compress the modulated subband signal to obtain a feedforward-compressed subband signal, wherein:
            the feedforward compressing comprises directly slowing the first DRC relative to an instantaneous DRC by adjusting one or more of an attack time constant and a release time constant of the first DRC; and
            the adjusting of the attack time constant and/or the release time constant of the first DRC is based on a reference time constant τ that corresponds to the reference frequency f of the given subband signal;
         provide the feedforward-compressed subband signal to a second processing path that includes a second DRC, compress the feedforward-compressed subband signal by the second DRC; and
         provide an output of the second processing path to the modulator, wherein modulating the feedforward-compressed subband signal by the modulator is performed in dependence on the output of the second processing path; and
      recombine the feedforward-compressed subband signals.

16. The device of claim 15, further comprising instructions which when executed by the at least one processor causes the at least one processor to:
   divide an unprocessed audio signal into a first signal pathway and a second signal pathway;

process the unprocessed audio signal in the first signal pathway; and recombine outputs of the first signal and second signal pathways at a ratio.

17. The device of claim 15, further comprising instructions which when executed by the at least one processor causes the at least one processor to:

for each subband signal of the plurality of subband signals:
provide the feedforward-compressed subband signal to a second processing path that includes a second DRC;
provide one or more feedforward-compressed subband signals from neighboring frequency bands, each weighted with a weighting factor, to the second processing path; and
compress, in the second processing path, the feedforward-compressed subband signal and the weighted feedforward-compressed subband signals from the neighboring frequency subbands by the second DRC.

18. At least one non-transitory computer readable storage medium storing instructions, which when executed by at least processor cause the processor to:

perform a spectral decomposition of an audio signal into a plurality of subband signals using a band pass filter, where each subband signal is associated with at least one reference frequency f within the subband;

for each given subband signal of the plurality of subband signals:
provide the subband signal to a modulator and from the modulator output, providing the modulated subband signal to a first processing path that includes a first dynamic range compressor (DRC);
feedforward compress the modulated subband signal to obtain a feedforward-compressed subband signal, wherein:
the feedforward compressing comprises directly slowing the first DRC relative to an instantaneous DRC by adjusting one or more of an attack time constant and a release time constant of the first DRC; and
the adjusting of the attack time constant and/or the release time constant of the first DRC is based on a reference time constant $\tau$ that corresponds to the reference frequency f of the given subband signal;
provide the feedforward-compressed subband signal to a second processing path that includes a second DRC, compress the feedforward-compressed subband signal by the second DRC; and
provide an output of the second processing path to the modulator, wherein modulating the feedforward-compressed subband signal by the modulator is performed in dependence on the output of the second processing path; and
recombine the feedforward-compressed subband signals.

19. The least one non-transitory computer readable storage medium of claim 18, further comprising instructions which when executed by the at least one processor causes the at least one processor to:

divide an unprocessed audio signal into a first signal pathway and a second signal pathway;
process the unprocessed audio signal in the first signal pathway; and
recombine outputs of the first signal and second signal pathways at a ratio.

20. The least one non-transitory computer readable storage medium of claim 18, further comprising instructions which when executed by the at least one processor causes the at least one processor to:

for each subband signal of the plurality of subband signals:
provide the feedforward-compressed subband signal to a second processing path that includes a second DRC;
provide one or more feedforward-compressed subband signals from neighboring frequency bands, each weighted with a weighting factor, to the second processing path; and
compress, in the second processing path, the feedforward-compressed subband signal and the weighted feedforward-compressed subband signals from the neighboring frequency subbands by the second DRC.

* * * * *